United States Patent
Honda

(10) Patent No.: US 8,760,937 B2
(45) Date of Patent: *Jun. 24, 2014

(54) SEMICONDUCTOR MEMORY DEVICE WITH BIT LINE CHARGING CIRCUIT AND CONTROL METHOD THEREOF

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

This patent is subject to a terminal disclaimer.

(21) Appl. No.: 13/324,413

(22) Filed: Dec. 13, 2011

(65) Prior Publication Data

US 2012/0163088 A1 Jun. 28, 2012

(30) Foreign Application Priority Data

Dec. 22, 2010 (JP) .................................. 2010-286321

(51) Int. Cl.
*G11C 7/10* (2006.01)

(52) U.S. Cl.
USPC ............. 365/189.06; 365/185.25; 365/189.15

(58) Field of Classification Search
USPC ....... 365/185.17, 185.18, 185.25 X, 189.011, 365/189.15, 189.06 O, 185.25, 189.06, 365/189.15 X See application file for complete search history.

(56) References Cited

U.S. PATENT DOCUMENTS

| | | | |
|---|---|---|---|
| 7,486,562 B2* | 2/2009 | Ogawa et al. | 365/185.21 |
| 7,701,777 B2* | 4/2010 | Ogawa et al. | 365/185.21 |
| 2006/0133139 A1 | 6/2006 | Sakurai et al. | |
| 2011/0157996 A1 | 6/2011 | Honda | |

FOREIGN PATENT DOCUMENTS

| | | |
|---|---|---|
| JP | 2000-48585 | 2/2000 |
| JP | 2006-147111 | 6/2006 |

* cited by examiner

*Primary Examiner* — Vanthu Nguyen
(74) *Attorney, Agent, or Firm* — Oblon, Spivak, McClelland, Maier & Neustadt, L.L.P.

(57) ABSTRACT

According to one embodiment, a semiconductor memory device includes a memory cell array including memory cells, each of which is arranged at a position of between a word line and a bit line, a row decoder, and a bit line control circuit. And when data is to be read out from the memory cell, a charge control circuit controls the gate voltages of a first transistor, a second transistor, a third transistor, and a fourth transistor, respectively, so that the bit line is charged in accordance with a first characteristic obtained by increasing a current driving capacity of the first transistor during a desired period after start of charge of the bit line, and the bit line is then charged in accordance with a second characteristic obtained by returning the current driving capacity of the first transistor to the lower current driving capacity after elapse of the desired period.

18 Claims, 18 Drawing Sheets

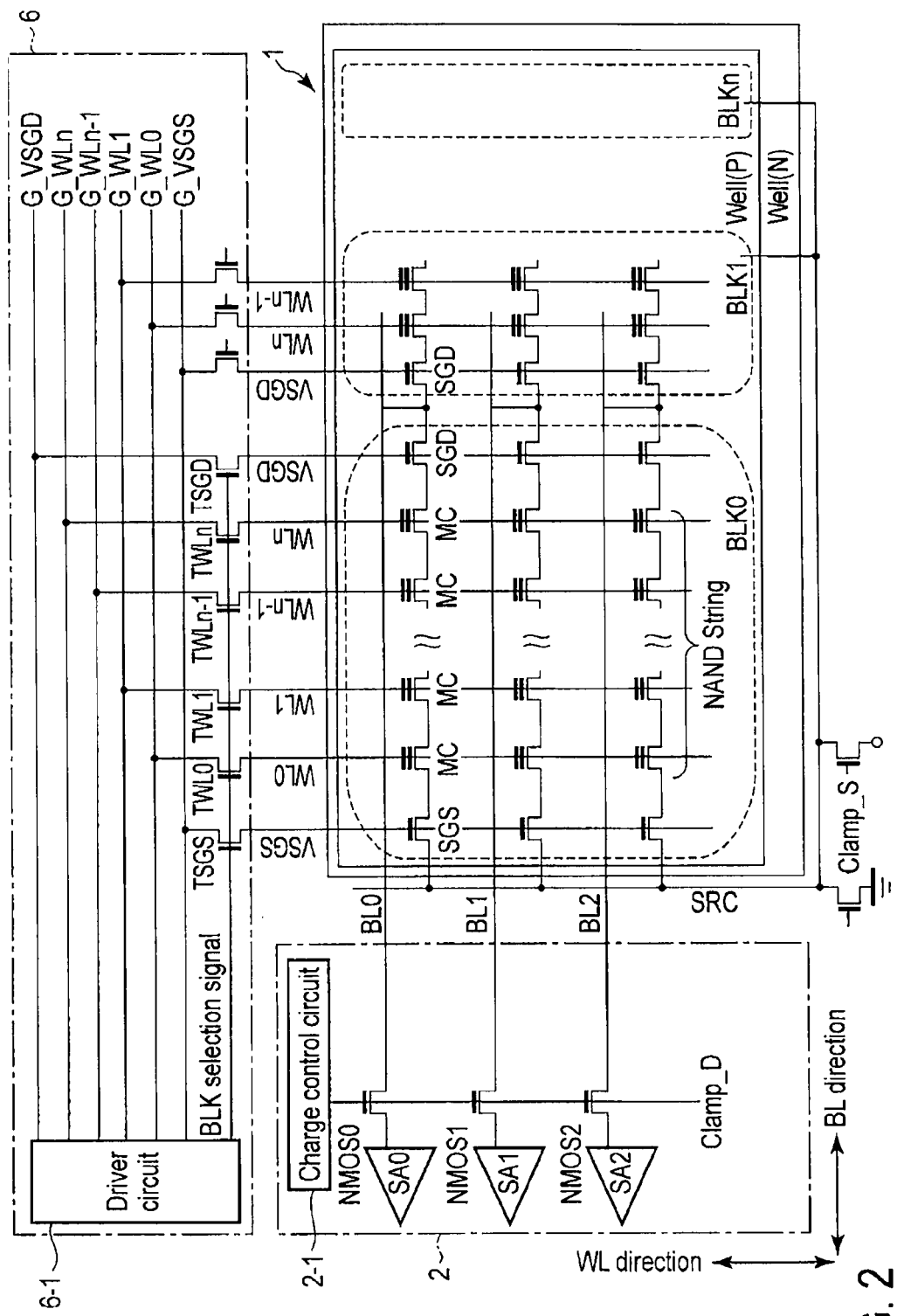
F I G. 2

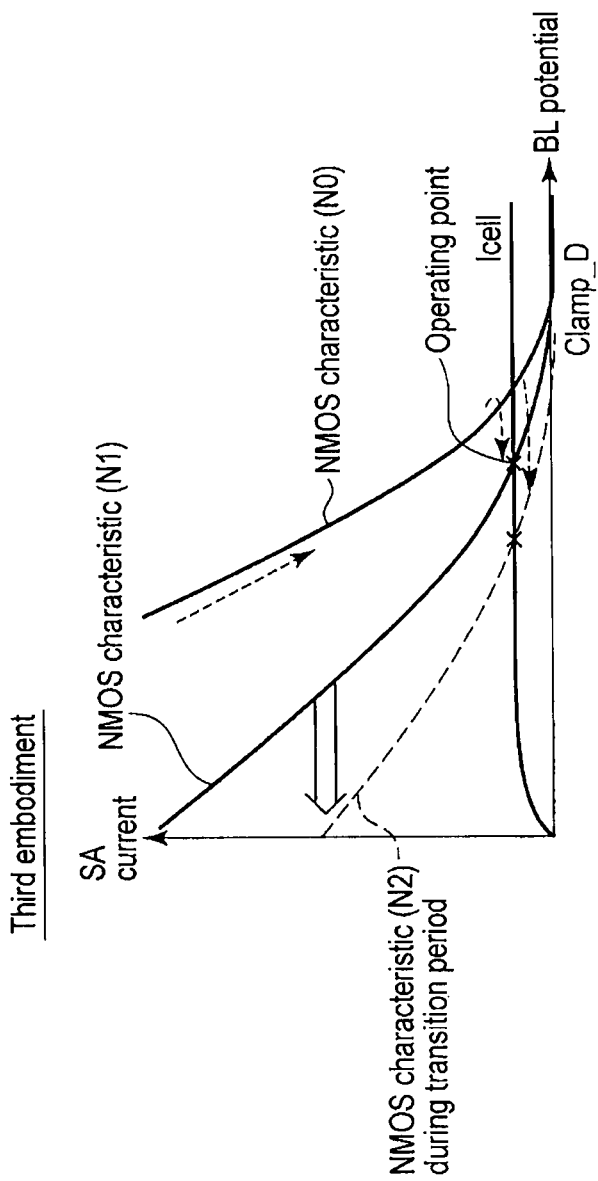
F I G. 14

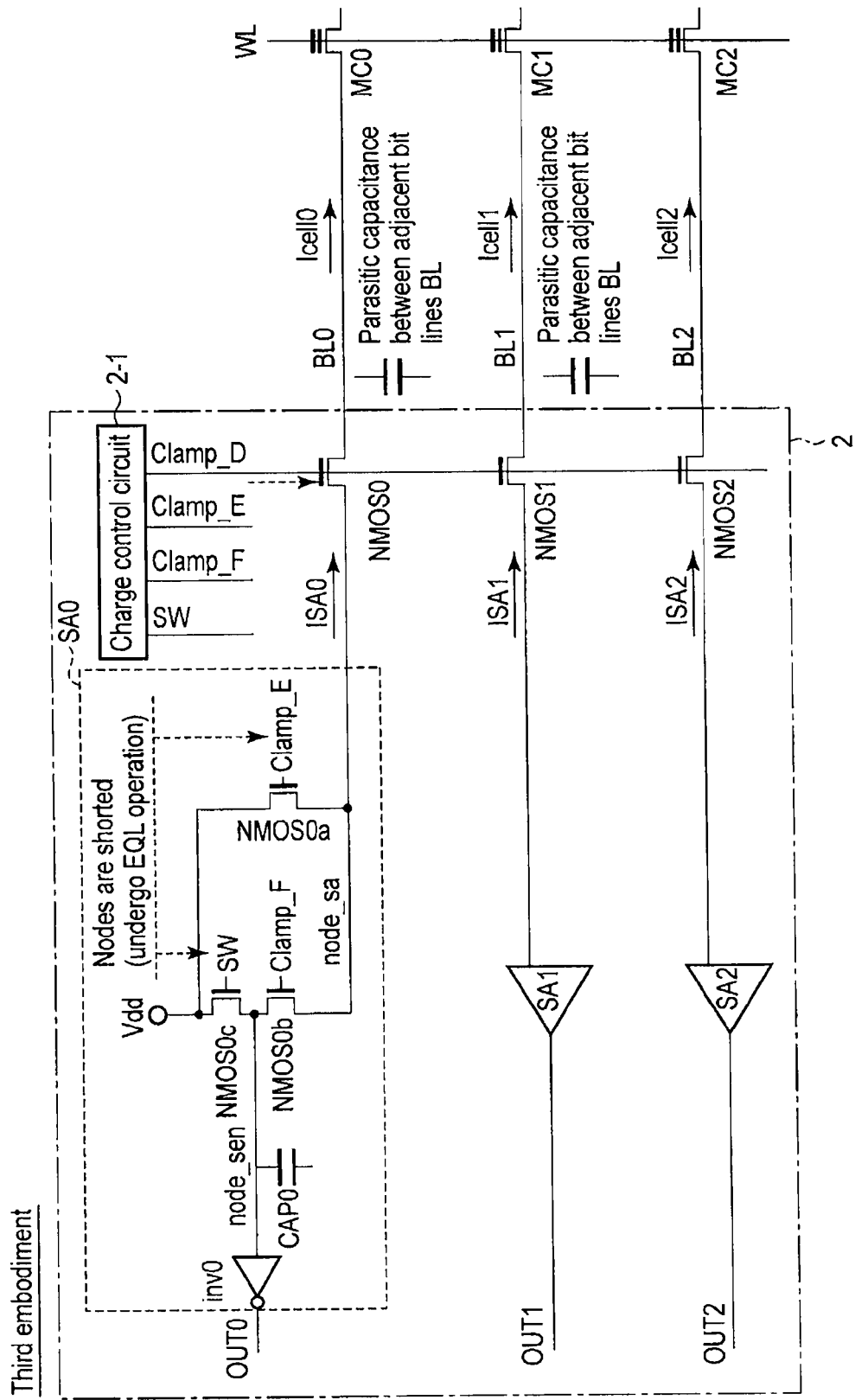
F I G. 15

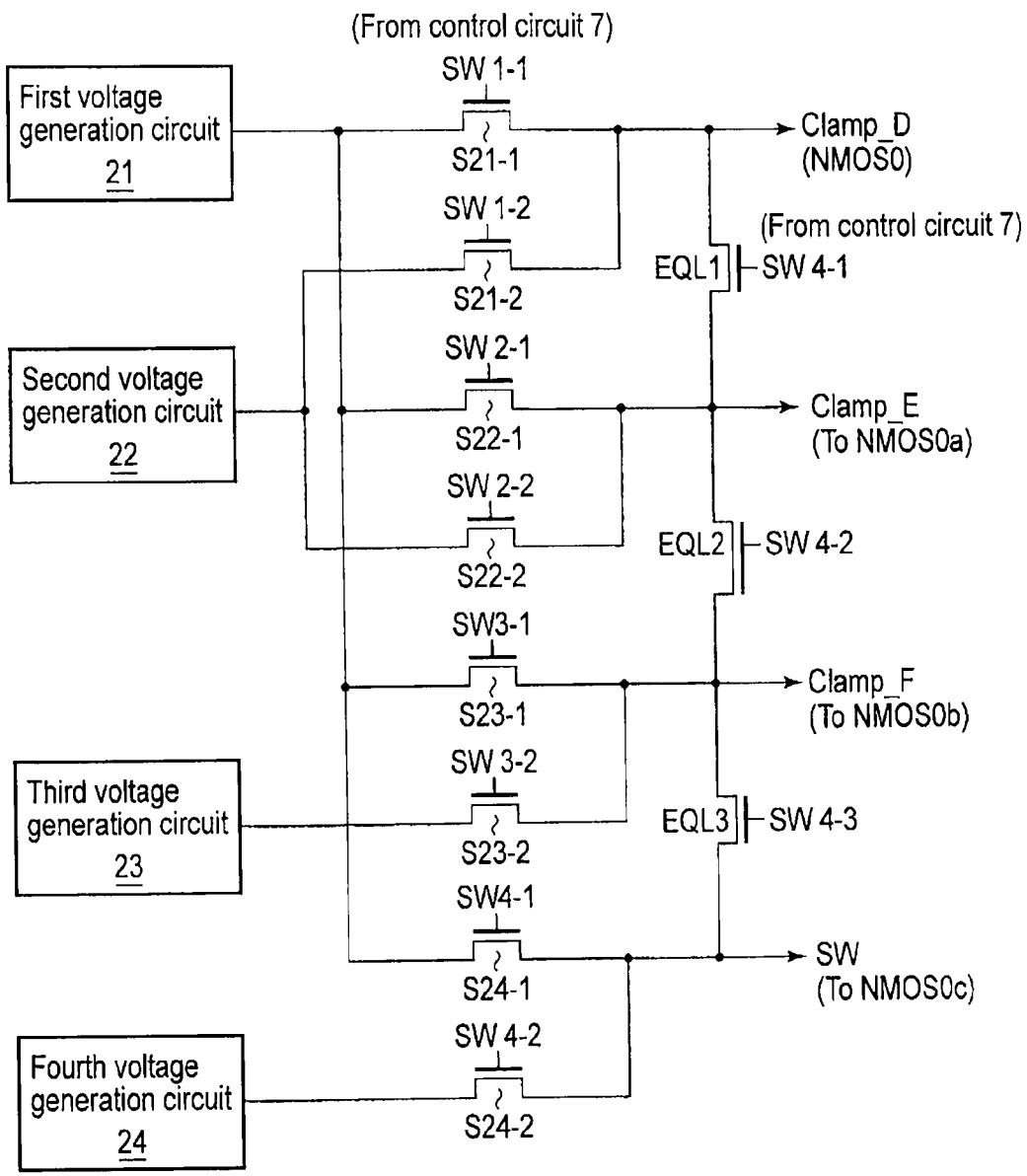
F I G. 16

SEMICONDUCTOR MEMORY DEVICE WITH BIT LINE CHARGING CIRCUIT AND CONTROL METHOD THEREOF

CROSS-REFERENCE TO RELATED APPLICATIONS

This application is based upon and claims the benefit of priority from prior Japanese Patent Application No. 2010-286321, filed Dec. 22, 2010, the entire contents of which are incorporated herein by reference.

FIELD

Embodiments described herein relate generally to, for example, a semiconductor memory device and a control method therefor.

BACKGROUND

Conventionally, the read characteristic of a NAND flash memory which exemplifies a semiconductor memory device is mainly determined by charge of bit lines. In such a NAND flash memory, with advances in micropatterning of the manufacturing process, the decrease in memory cell current and the mutual interference between adjacent bit lines become conspicuous, so the read characteristic may degrade.

Also, a read operation is performed in verify at the time of a write or erase operation in or from the NAND flash memory as well, so the write or erase characteristic may similarly degrade.

BRIEF DESCRIPTION OF THE DRAWINGS

FIG. 2 is an equivalent circuit diagram illustrating an example of a memory cell array and its peripheral circuit shown in FIG. 1;

FIG. 14 is a graph for explaining the load characteristic according to the third embodiment;

FIG. 15 is an equivalent circuit diagram illustrating an example of the arrangement of a bit line control circuit according to the third embodiment;

FIG. 16 is an equivalent circuit diagram illustrating an example of the arrangement of a charge control circuit according to the third embodiment;

DETAILED DESCRIPTION

Figure 1:
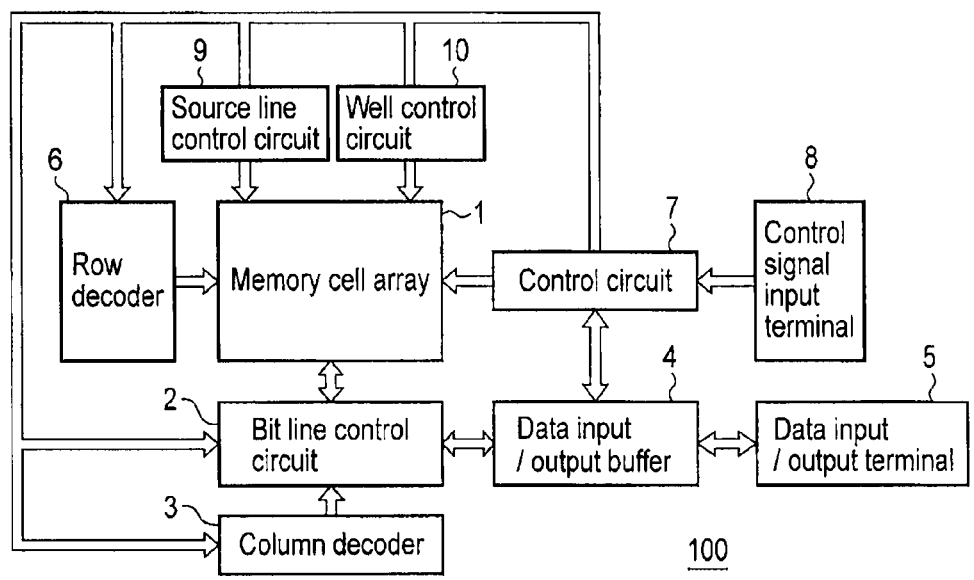
FIG. 1 is a block diagram illustrating an example of the entire arrangement of a semiconductor memory device according to the first embodiment.

In general, according to one embodiment, a semiconductor memory device includes a memory cell array including memory cells, each of which is arranged at a position corresponding to the intersection point between a word line and a bit line, a row decoder which applies a read voltage to the word line, and a bit line control circuit including a first transistor which has a current path with its one end connected to the bit line, and its other end connected to a first node, a second transistor which has a current path with its one end connected to the first node, and its other end connected to a power supply voltage, and fixes the potential of the first node, a third transistor which has a current path with its one end connected to the first node, and its other end connected to a second node, and fixes the potential of the first node, a fourth transistor which has a current path with its one end connected to the second node, and its other end connected to the power supply voltage, and a charge control circuit which controls the gate voltages of the first transistor, the second transistor, the third transistor, and the fourth transistor, respectively. When data is to be read out from the memory cell, the charge control circuit controls the gate voltages of the first transistor, the second transistor, the third transistor, and the fourth transistor, respectively, so that the bit line is charged in accordance with a first characteristic obtained by increasing the current driving capacity of the first transistor during a desired period after the start of charge of the bit line, and the bit line is then charged in accordance with a second characteristic obtained by returning the current driving capacity of the first transistor to the lower current driving capacity after the elapse of the desired period.

Embodiments will be described below with reference to the accompanying drawings. A semiconductor memory device will be described in detail hereinafter by taking a NAND flash memory as an example. Note that in the following description, the same reference numerals denote the same parts throughout the drawings.

[First Embodiment]

A semiconductor memory device according to the first embodiment will be described first with reference to FIGS. 1, 2, 3, 4, 5, 6, 7, 8, 9, 10 and 11.

<1. Arrangement Example>

1-1. Example of Entire Arrangement

An example of the entire arrangement of a NAND flash memory 100 which exemplifies a semiconductor memory device according to the first embodiment will be described first with reference to FIG. 1.

The NAND flash memory 100 includes a memory cell array 1, bit line control circuit 2, column decoder 3, data input/output buffer 4, data input/output terminal 5, row decoder 6, control circuit 7, control signal input terminal 8, source line control circuit 9, and well control circuit 10, as shown in FIG. 1.

The memory cell array 1 includes a plurality of bit lines, a plurality of word lines, a source line SRC, and a plurality of memory cells, as will be described later. The plurality of memory cells are arranged at positions corresponding to the intersection points between the bit lines and the word lines. The memory cell array 1 is formed from a plurality of blocks BLK. In the blocks BLK, electrically rewritable memory cells are arranged in a matrix. Each memory cell has, for example, a stacked structure including a control gate electrode and a charge storage layer (for example, a floating gate electrode), and stores binary or multi-level data in accordance with a change in threshold of a transistor, which is determined by the amount of charge injected into the charge storage layer. Note that each memory cell may have a MONOS (Metal-Oxide-Nitride-Oxide-Silicon) structure which traps electrons in a nitride film.

The memory cell array 1 is electrically connected to the bit line control circuit 2 used to control the voltages of bit lines BL, and the row decoder 6 used to control the voltages of word lines WL.

The bit line control circuit 2 includes data storage circuits and a charge control circuit (neither is shown). The data storage circuits serves both as sense amplifiers which sense and amplify the voltages of the bit lines in the memory cell array 1, and data latch circuits which latch data. Also, the charge control circuit controls a clamp NMOS transistor (to be described later). Note that the bit line control circuit 2 will be described in detail later.

The bit line control circuit 2 reads out data from each memory cell via a corresponding bit line, detects the state of the memory cell via the bit line, or writes data in the memory cell by applying a write voltage to the memory cell via the bit line. Also, the bit line control circuit 2 is electrically connected to the column decoder 3 and data input/output buffer 4. A data storage circuit in the bit line control circuit 2 is selected by the column decoder 3. Data read out from each memory cell to the data storage circuit is output to the outside from the data input/output terminal 5 via the data input/output buffer 4.

Write data which is externally input to the data input/output terminal 5 is stored in the data storage circuit, which is selected by the column decoder 3, via the data input/output buffer 4.

The data input/output terminal 5 receives not only write data but also addresses and various commands such as write, read, erase, and status read commands.

The row decoder 6 is electrically connected to the memory cell array 1. The row decoder 6 applies voltages necessary for a read operation, a write operation, or an erase operation to the word lines and select gate lines in the memory cell array 1. Also, the row decoder 6 includes a driver control circuit connected to a plurality of control lines (to be described later) so as to selectively apply voltages to the word lines and select gate lines. In, for example, a data erase operation, one of the plurality of blocks BLK is selected by the row decoder 6, and the remaining blocks are kept unselected.

The source line control circuit 9 is electrically connected to the memory cell array 1. The source line control circuit 9 controls the voltage of the source line.

The well control circuit 10 is electrically connected to the memory cell array 1. The well control circuit 10 controls the voltage of a semiconductor substrate (well) on which memory cells are to be formed. In this embodiment, the memory cell array 1 adopts a double well structure, which has an N well (Well(N)) formed on a semiconductor substrate, and the plurality of blocks BLK arranged in a P well (Well(P)) formed on the N well.

The control circuit 7 controls the memory cell array 1, bit line control circuit 2, column decoder 3, data input/output buffer 4, row decoder 6, source line control circuit 9, and well control circuit 10. The control circuit 7 includes a boosting circuit (not shown) which boosts the power supply voltage. The control circuit 7 causes the boosting circuit to boost the power supply voltage as needed, and supplies the boosted voltage to the bit line control circuit 2, column decoder 3, data input/output buffer 4, row decoder 6, source line control circuit 9, and well control circuit 10. The control circuit 7 performs control operations in accordance with control signals (for example, a command latch enable signal CLE, an address latch enable signal ALE, and a ready/busy signal RY/BY) which are externally input via the control signal input terminal 8, and commands input via the data input/output buffer 4 from the data input/output terminal 5. That is, in programming, verifying, reading, or erasing data, the control circuit 7 generates desired voltages and supplies them to the units of the memory cell array 1, in accordance with control signals and commands, thereby controlling the operation of the overall NAND flash memory 100.

1-2. Memory Cell Array and its Peripheral Circuit

An example of the arrangement of the memory cell array and its peripheral circuit according to the first embodiment will be described next with reference to FIG. 2.

FIG. 2 illustrates an example of the detailed arrangement of the memory cell array 1, bit line control circuit 2, and row decoder 6.

The memory cell array 1 includes blocks BLK0, BLK1, ..., BLKn formed by juxtaposing NAND strings each including a plurality of memory cells MC having current paths connected in series with each other. Each NAND string is formed from n (for example, 64) memory cells MC having current paths connected in series with each other, and has its one end connected to a drain-side select MOS transistor SGD, and its other end connected to a source-side select MOS transistor SGS. The source-side select MOS transistor SGS is connected to the source line SRC.

The control gate electrodes of the memory cells MC arranged on each row are connected to word lines WL0 to WLn, respectively. Note that for the sake of simplicity, FIG. 2 illustrates only the word lines WL0, WL1, WLn-1, WLn, and WLn-1, and does not show word lines between them. A plurality of word lines will simply be referred to as the word lines WL if they require no particular distinction. The gate of the drain side select MOS transistor SGD is connected to a drain side select gate line VSGD. The gate of the source side select MOS transistor SGS is connected to a source side select gate line VSGS.

The row decoder 6 includes a driver circuit 6-1, a plurality of transfer NMOS transistors TSGS, TSGD, and TWL0 to TWLn corresponding to the respective blocks BLK, and a plurality of control lines G_VSGS, G_VSGD, G_WL0, G_WL1, ..., G_WLn-1, and G_WLn. The drains of the transfer NMOS transistors TSGS and TSGD are connected to the source-side select gate line VSGS and drain-side select gate line VSGD, respectively. The drains of the transfer NMOS transistors TWL0 to TWLn are connected to the word lines WL0 to WLn, respectively, which are connected to the control gates of corresponding sets of memory cells MC.

The sources of the transfer NMOS transistors TSGS, TSGD, and TWL0 to TWLn are connected to the control lines G_VSGS, G_VSGD, G_WL0, G_WL1, ..., G_WLn-1, and G_WLn, respectively, which are connected to the driver circuit 6-1. A block selection signal corresponding to an external address is input to the gates of the transfer NMOS transistors TSGS, TSGD, and TWL0 to TWLn. The driver circuit 6-1 controls the gate voltages and source voltages of the transfer NMOS transistors TSGS, TSGD, and TWL0 to TWLn in accordance with the output from the control circuit 7. That is, the row decoder 6 causes the driver circuit 6-1 to control the gate voltages and source voltages of the transfer NMOS transistors to select an arbitrary block BLK in the memory cell array 1, thereby executing a write or read operation in the selected block BLK.

Bit lines BL0, BL1, and BL2 are arranged perpendicularly to the word lines WL0 to WLn and source line SRC. Although FIG. 2 illustrates only the three bit lines BL0, BL1, and BL2 as a detailed example, the number of bits is not limited to this, as a matter of course. An arbitrary total number of bit lines, for example, 2,048 bit lines can be juxtaposed in one block BLK.

The bit line control circuit 2 includes a plurality of sense amplifiers SA0, SA1, and SA2, clamp transistors NMOS0 to NMOS2, and a charge control circuit 2-1.

The sense amplifiers SA0, SA1, and SA2 are connected to the bit lines BL0, BL1, and BL2 via the clamp transistors NMOS0 to NMOS2, respectively. Sense amplifiers SA sense or control the potentials of the bit lines BL. The charge control circuit 2-1 controls the gate voltages of the clamp transistors NMOS0 to NMOS2, and the sense amplifiers SA0, SA1, and SA2 to control, for example, charge of the bit lines BL0, BL1, and BL2. The arrangement and operation of the charge control circuit 2-1 will be described in detail later.

1-3. Phenomenon in which Read Characteristic Degrades Due to Mutual Interference with Adjacent Bit Line A phenomenon in which the read characteristic degrades due to mutual interference with an adjacent bit line will be described next with reference to FIGS. 3, 4, 5, 6 and 7.

Figure 3:
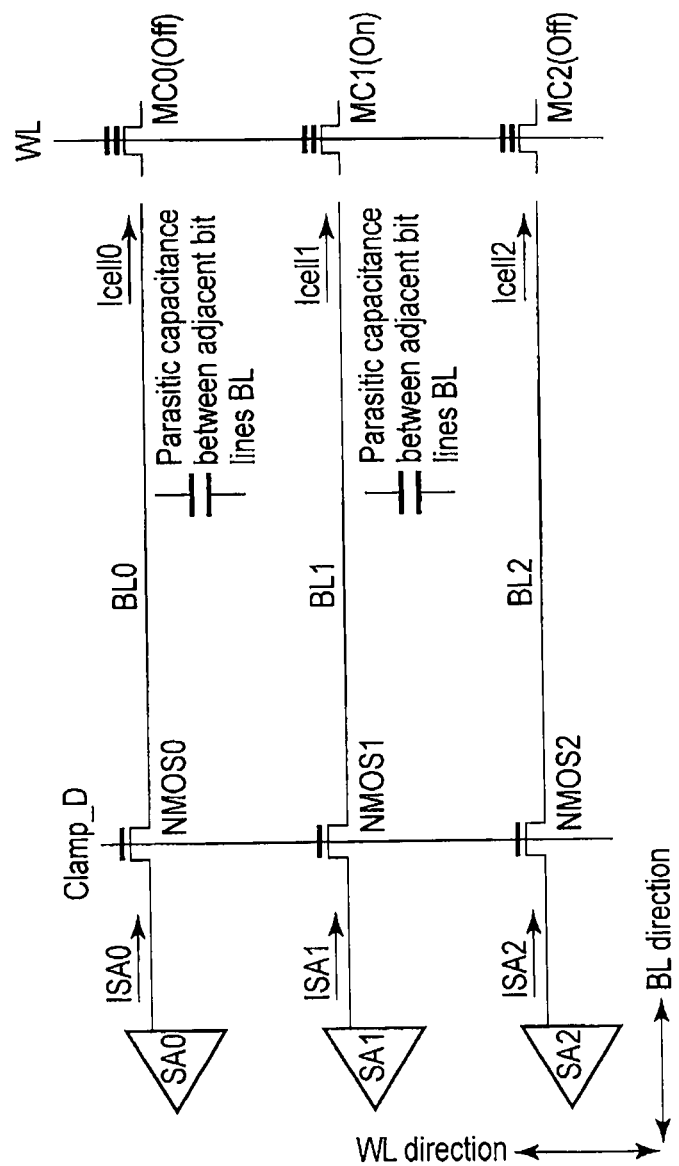
FIG. 3 is an equivalent circuit diagram illustrating an arrangement shown in FIG. 2.

FIG. 3 shows the three adjacent bit lines BL0, BL1, and BL2, the clamp transistors NMOS0 to NMOS2 used to clamp the potentials of these bit lines, respectively, and the sense amplifiers SA0, SA1, and SA2 used to sense the potentials of these bit lines, respectively. The gates of the clamp transistors NMOS0 to NMOS2 are controlled by a gate signal Clamp_D. Reference symbols ISA0 to ISA2 denote the currents flowing from the sense amplifiers SA0 to SA2, respectively; and Icell0 to Icell2, the currents flowing through memory cells MC0 to MC2, respectively.

The adjacent bit lines BL0 and BL1 and the adjacent bit lines BL1 and BL2 have adjacent parasitic capacitances between them. Note that bit lines adjacent to the adjacent bit lines BL have parasitic capacitances between them as well.

A data read operation by the semiconductor memory device having the above-mentioned arrangement when the memory cell MC1 connected to the bit line BL1 is turned on, and the memory cells MC0 and MC2 connected to the bit lines BL0 and BL2, respectively, are turned off will be described.

Figure 4:
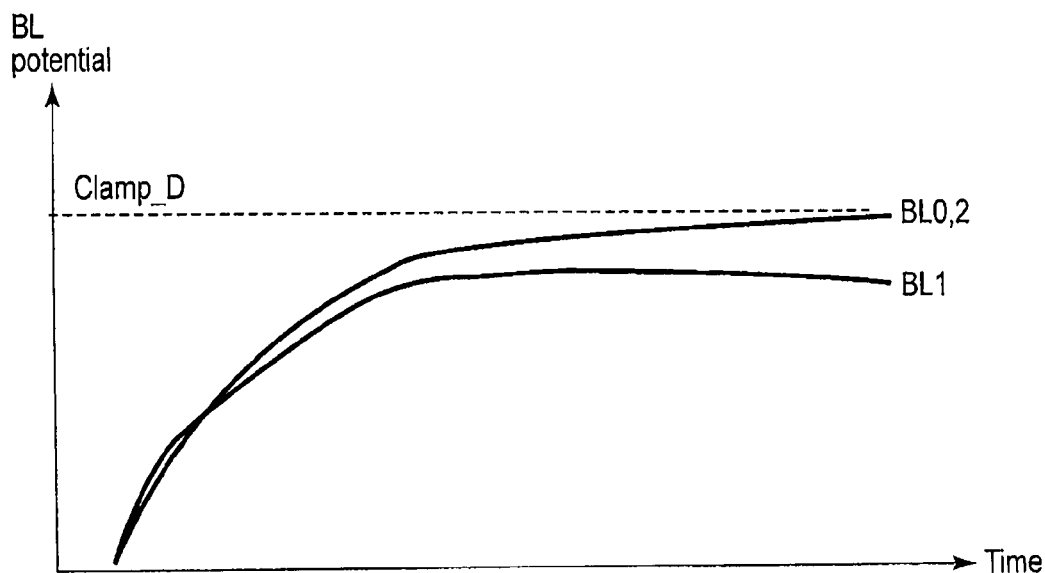
FIG. 4 is a graph illustrating the relationship between time and the bit line potential in data read.
Figure 5:
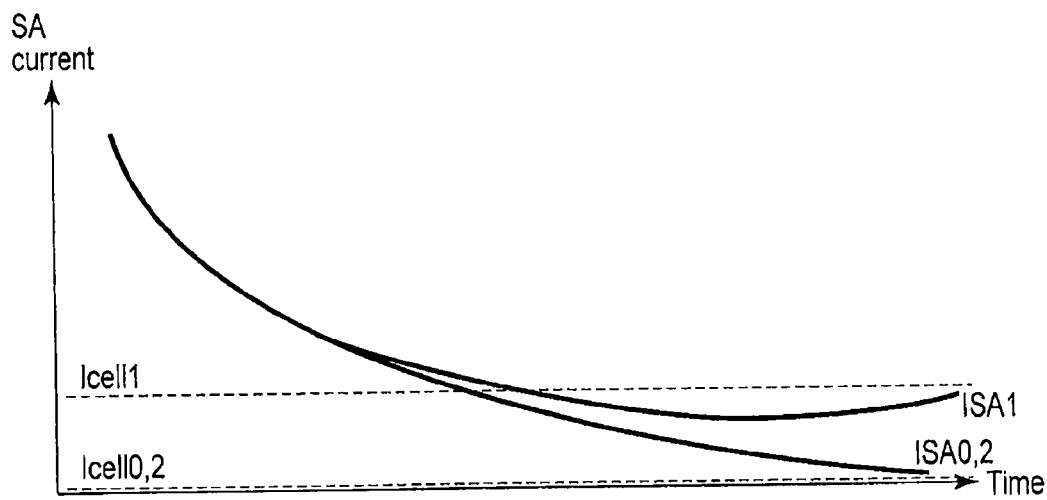
FIG. 5 is a graph illustrating the relationship between time and the sense amplifier current in data read.

FIGS. 4 and 5 show a change in bit line potential and a change in current flowing from each sense amplifier, respectively, in the data read operation in that case. FIG. 4 illustrates the relationship between time and the bit line potential in the data read operation. FIG. 5 illustrates the relationship between time and the sense amplifier current in the data read operation.

As is obvious from FIG. 5, the current "ISA1" becomes smaller (less) than the current "Icell1". On the other hand, as is obvious from FIG. 5 as well, the current "ISA0,2" is always larger (more) than the current "Icell0,2". The operating point of charge of the bit lines BL0 and BL2 connected to the memory cells MC0 and MC2, respectively, in an OFF state is highest, so their charge time is long. Also, the potential of the bit line BL1 connected to the memory cell MC1 in an ON state rises due to the parasitic capacitance between the adjacent bit lines BL0 and BL2, so the apparent memory cell current ISA1 when viewed from the sense amplifier SA1 decreases.

In this manner, the inventor observed the following phenomenon. That is, with miniaturization of memory cells, the memory cell current in an ON state decreases, and the increase in parasitic capacitance between adjacent bit lines becomes conspicuous. As a result, it takes a long time to stabilize the currents of both a memory cell in an ON state and a memory cell in an OFF state, when viewed from the sense amplifiers.

In this case, the fact that the current (for example, the current ISA1) of a specific memory cell decreases reveals that its corresponding bit line requires charging up to a sufficiently high level. Also, the fact that the coupling between adjacent bit lines increases reveals that an ON cell (selected cell MC1) with a low operating point and an OFF cell (unselected cell MC0 or MC2) with a high operating point interfere with each other so as to delay arrival at the operating points. This phenomenon becomes conspicuous when a comparison is made with an extreme case in which adjacent bit lines have no coupling.

Further, with miniaturization of memory cells, the amount of interference increases due to the above-mentioned coupling.

Load Characteristic

Figure 6:
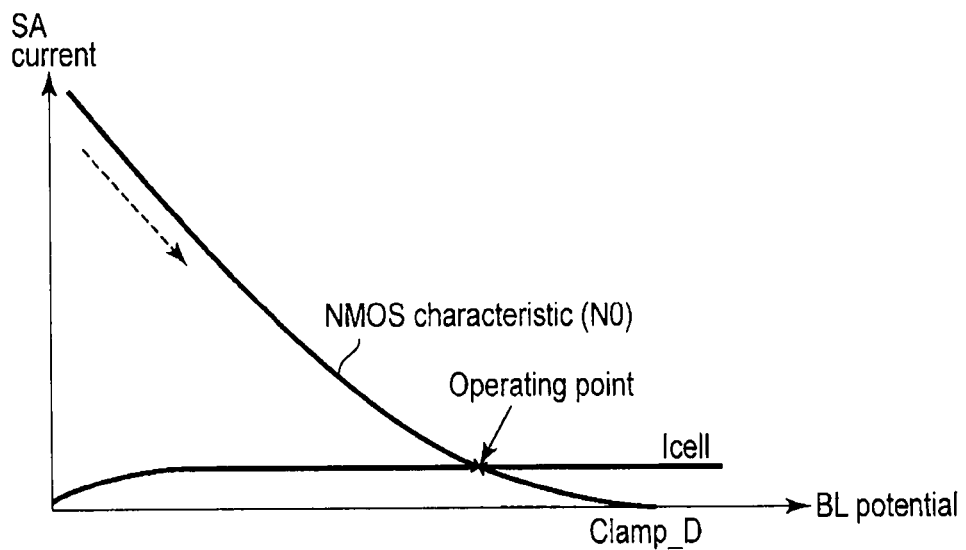
FIG. 6 is a graph showing the load characteristic according to a Comparative Example.

A mechanism of a change in bit line potential according a Comparative Example will be described next with reference to a load characteristic graph shown in FIG. 6. As shown in FIG. 6, the potential of the bit line BL changes in accordance with the characteristic line (N0) of the NMOS transistor NMOS0 which clamps the potential of the bit line BL, and reaches an operating point that is the intersection point with a memory cell current Icell. Upon reaching the operating point, the currents of the memory cells in an OFF state and an ON state stabilize, and therefore reach an equilibrium, as shown in FIG. 6. In other words, the load characteristic (N0) of this NMOS transistor becomes a factor which determines the bit line charging capacity.

Figure 7:
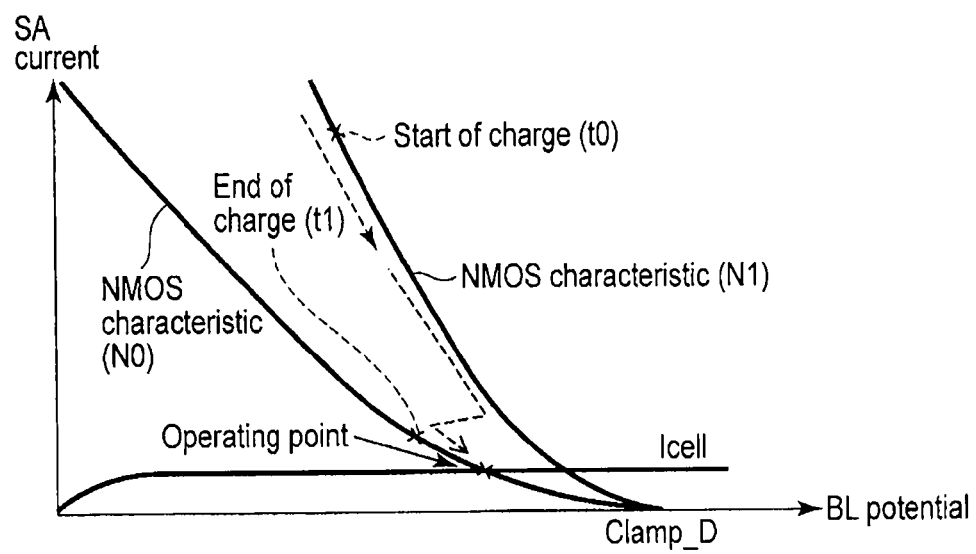
FIG. 7 is a graph showing the load characteristic according to the first embodiment.

A mechanism of a change in bit line potential according to the first embodiment will be described next with reference to a load characteristic graph shown in FIG. 7. As shown in FIG. 7, to improve the bit line charging capacity, in this embodiment, first, during a desired period (to be also referred to as the initial charge period hereinafter) after the start of charge of the bit line BL (this time is indicated by t0 in FIG. 7), the bit line BL is rapidly charged in accordance with the load characteristic (N1: first characteristic) of the clamp NMOS transistor NMOS0, which expresses a charging capacity (current driving capacity) higher than that expressed by the load characteristic (N0).

On the other hand, after the elapse of the desired period (this time will also be referred to as the end of charge and is indicated by t1 in FIG. 7), the charging capacity (current driving capacity) of the clamp transistor NMOS0 is returned to the lower charging capacity to charge the bit line BL in accordance with, for example, the same load characteristic (N0: second characteristic) of the NMOS transistor as in the Comparative Example. As a result, control is done so that the operating point is determined by the load characteristic (N0: second characteristic) of the NMOS transistor.

This makes it possible to provide a semiconductor memory device and a control method therefor which can charge each bit line at high speed by improving the charging capacity of the bit line while maintaining a given operating point of the bit line. Details will be described later.

1-4. Bit Line Control Circuit

Figure 8:
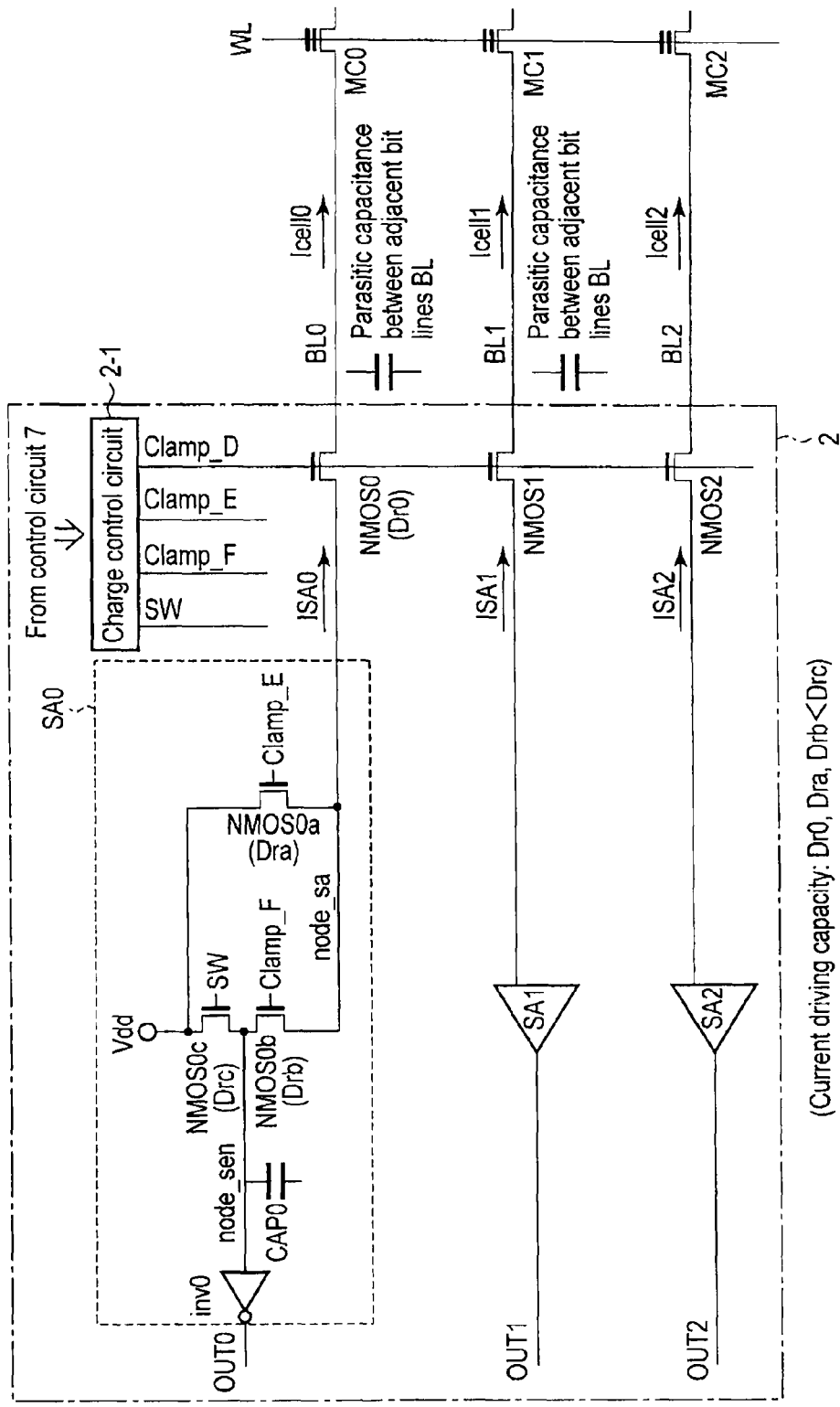
FIG. 8 is an equivalent circuit diagram illustrating an example of the arrangement of a bit line control circuit according to the first embodiment.

An example of the arrangement of a bit line control circuit according to the first embodiment will be described next with reference to FIG. 8. FIG. 8 illustrates details of the internal arrangement of the sense amplifier SA0. Note that for the sake of descriptive simplicity, the sense amplifiers SA1 and SA2 have the same internal arrangement as the sense amplifier SA0.

The bit line control circuit 2 includes the clamp transistors NMOS0, NMOS1, and NMOS2 which fix the potentials of the bit lines BL, and the sense amplifiers SA0, SA1, and SA2.

The charge control circuit 2-1 controls gate signals Clamp_D, Clamp_E, Clamp_F, and SW under the control of the control circuit 7. Thus, the bit line BL0 is charged. The charge control circuit 2-1 detects and checks the memory cell current Icell flowing through the memory cell MC. Therefore, the gate signals Clamp_D, Clamp_E, and Clamp_F are input to the gates of clamp transistors NMOS0, NMOS0$a$, and NMOS0$b$, respectively. Also, the gate signal SW is input to the gate of a switch transistor NMOS0$c$.

The clamp transistor NMOS0 (first transistor) has a function of clamping the potential of the bit line BL under the control of the charge control circuit 2-1. The clamp transistor NMOS0 has a current path with its one end connected to the bit line BL0, and its other end connected to a node node_sa in the sense amplifier SA0, and has its gate supplied with the gate signal Clamp_D.

The sense amplifier SA0 includes the clamp transistors NMOS0$a$ and NMOS0$b$, the switch transistor NMOS0$c$, and an inverter inv0.

The clamp transistor NMOS0$a$ (second transistor) has a function of fixing the potential of the node node_sa under the control of the charge control circuit 2-1. The clamp transistor NMOS0$a$ has a current path with its one end connected to the node node_sa, and its other end connected to a power supply voltage Vdd, and has its gate supplied with the gate signal Clamp_E.

The clamp transistor NMOS0$b$ (third transistor) has a function of fixing the potential of the node node_sa under the control of the charge control circuit 2-1. The clamp transistor NMOS0$b$ has a current path with its one end connected to the node node_sa, and its other end connected to a node node_sen, and has its gate supplied with the gate signal Clamp_F.

The switch transistor NMOS0$c$ (fourth transistor) has a function of charging and discharging a capacitor CAP0 under the control of the charge control circuit 2-1. The switch transistor NMOS0$c$ has a current path with its one end connected to the node node_sen, and its other end connected to the power supply voltage Vdd, and has its gate supplied with the gate signal SW.

The inverter inv0 has its input connected to the node node_sen, and its output connected to an output terminal OUT0 of the bit line control circuit 2.

One end of the electrode of the capacitor CAP0 is connected to the node node_sen. The capacitor CAP0 is charged to have a power supply voltage vdd when the switch transistor NMOS0$c$ is ON, and it is charged to have the cell voltage of the memory cell MC0 when the switch transistor NMOS0$c$ is OFF.

Note that the clamp transistors NMOS0, NMOS0$a$, and NMOS0$b$ use transistors having gate lengths larger than that of the switch transistor NMOS0$c$ to suppress a variation in threshold. Also, the clamp transistors NMOS0, NMOS0$a$, and NMOS0$b$ have the same size. This means that the clamp transistors NMOS0, NMOS0$a$, and NMOS0$b$ have charging capacities Dr0, Dra, and Drb lower than the charging capacity Drc of the switch transistor NMOS0$c$ (charging capacities: Dr0, Dra, Drb<Drc).

On the other hand, the switch transistor NMOS0$c$ has a switch function. The switch transistor NMOS0$c$ has a gate length smaller than those of the clamp transistors NMOS0, NMOS0$a$, and NMOS0$b$. The switch transistor NMOS0$c$ has a charging capacity Drc higher than the charging capacities Dr0, Dra, and Drb of the clamp transistors NMOS0, NMOS0$a$, and NMOS0$b$, respectively.

1-5. Charge Control Circuit

Figure 9:
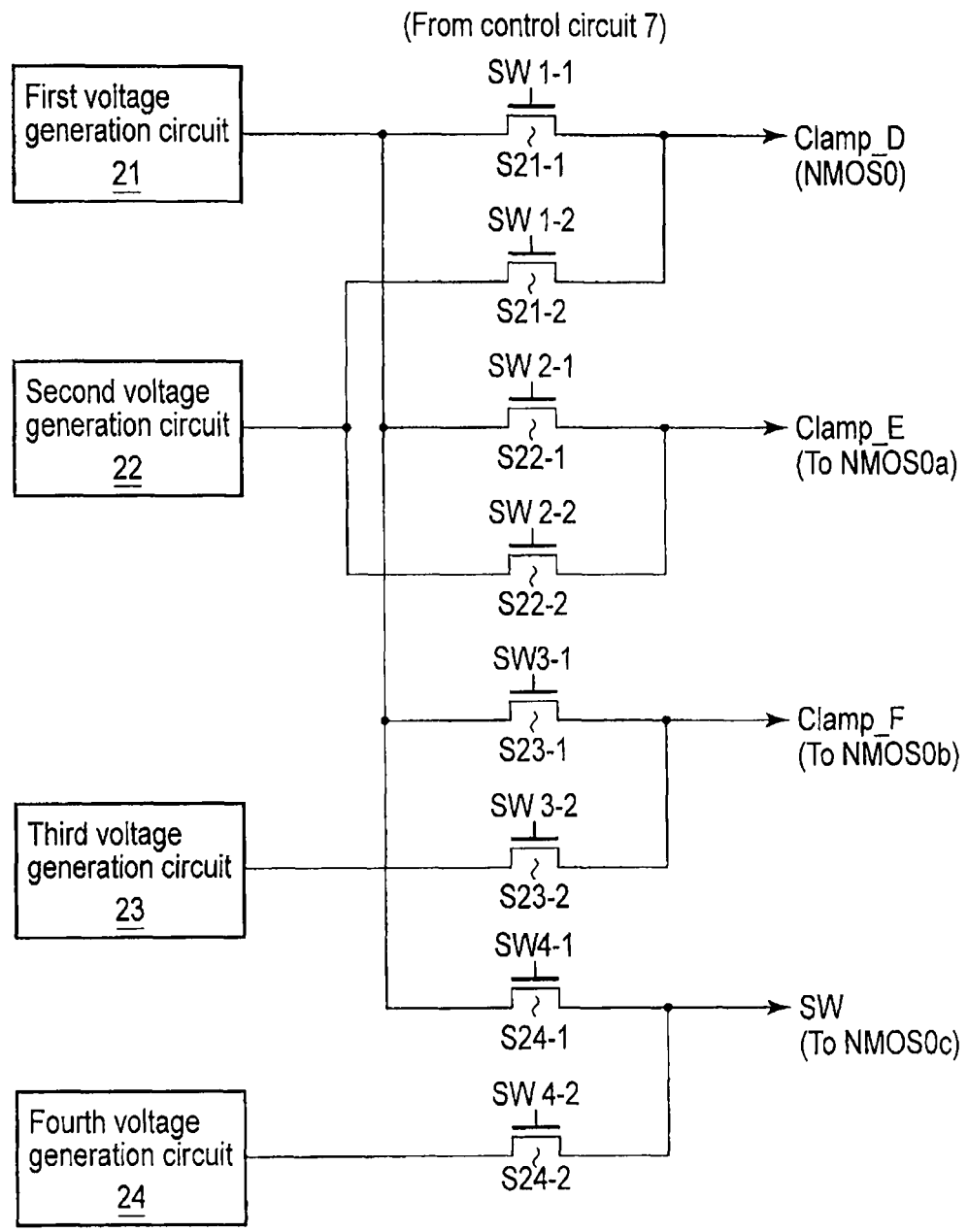
FIG. 9 is an equivalent circuit diagram illustrating an example of the arrangement of a charge control circuit according to the first embodiment.

An example of the arrangement of the charge control circuit 2-1 according to the first embodiment will be described next with reference to FIG. 9. The charge control circuit 2-1 according to this embodiment includes first to fourth voltage generation circuits 21 to 24, and switching elements S21-1 to S24-2, as shown in FIG. 9.

The first to fourth voltage generation circuits 21 to 24 generate predetermined voltages (for example, an ON voltage Vthn for the clamp transistor NMOS0).

The switching elements S21-1 to S24-2 have their gates supplied with control signals SW1-1 to SW4-2, respectively, from the control circuit 7 to control conduction/nonconduction of their current paths.

The current path of the switching element S21-1 has its one end connected to the output of the first voltage generation circuit 21, and its other end serving as a terminal which outputs the gate signal Clamp_D of the clamp transistor NMOS0. The current path of the switching element S21-2 has its one end connected to the output of the second voltage generation circuit 22, and its other end serving as a terminal which outputs the gate signal Clamp_D of the clamp transistor NMOS0.

The current path of the switching element S22-1 has its one end connected to the output of the first voltage generation circuit 21, and its other end serving as a terminal which outputs the gate signal Clamp_E of the clamp transistor NMOS0$a$. The current path of the switching element S22-2 has its one end connected to the output of the second voltage generation circuit 22, and its other end serving as a terminal which outputs the gate signal Clamp_E of the clamp transistor NMOS0$a$.

The current path of the switching element S23-1 has its one end connected to the output of the first voltage generation circuit 21, and its other end serving as a terminal which outputs the gate signal Clamp_F of the clamp transistor NMOS0$b$. The current path of the switching element S23-2 has its one end connected to the output of the second voltage generation circuit 22, and its other end serving as a terminal which outputs the gate signal Clamp_F of the clamp transistor NMOS0$b$.

The current path of the switching element S24-1 has its one end connected to the output of the first voltage generation circuit 21, and its other end serving as a terminal which outputs the gate signal SW of the switch transistor NMOS0$c$. The current path of the switching element S24-2 has its one end connected to the output of the fourth voltage generation circuit 24, and its other end serving as a terminal which outputs the gate signal SW of the switch transistor NMOS0$c$.

<2. Data Read Operation>

A data read operation (of a sense scheme according to this embodiment) by the sense amplifier SA will be described next with reference to FIGS. 10 and 11. This description will be given with reference to a timing chart shown in FIG. 10.

Figure 10:
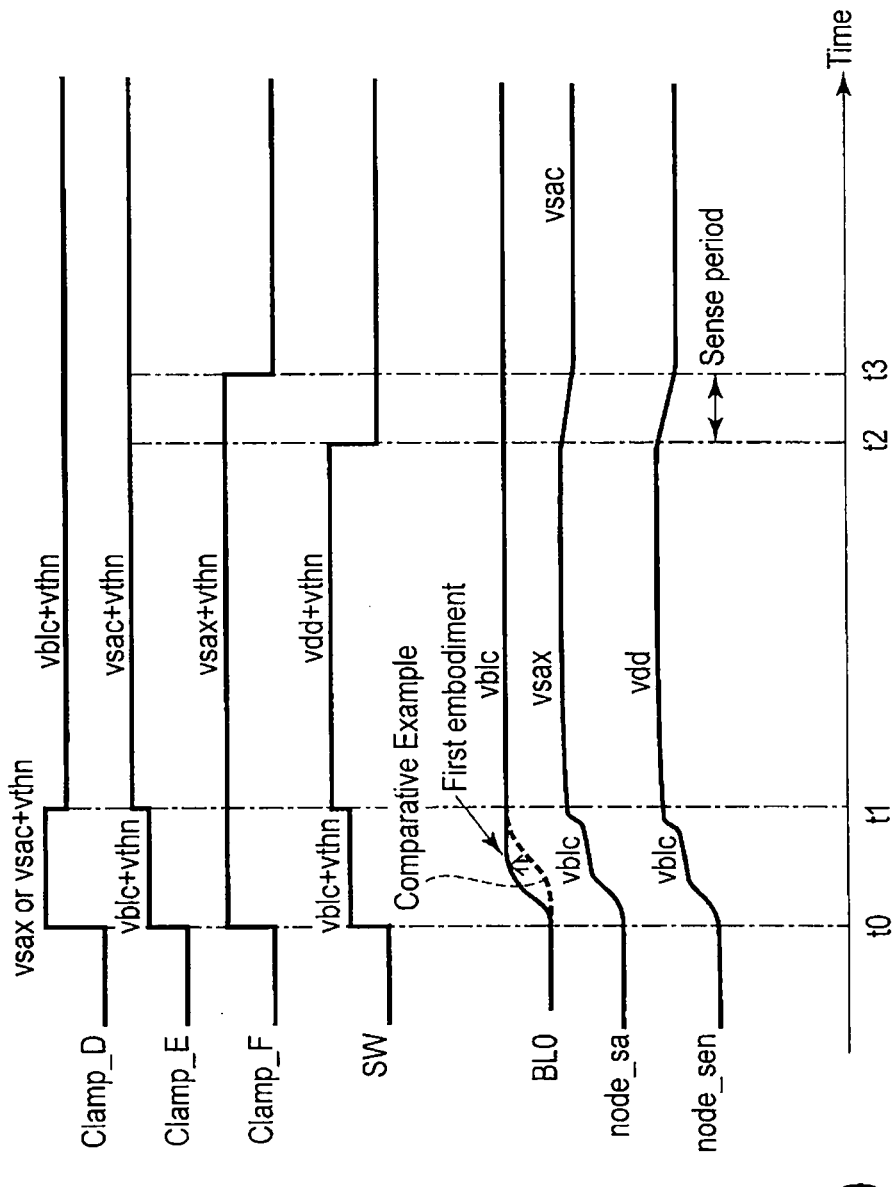
FIG. 10 is a timing chart showing a sense operation in data read according to the first embodiment.

As shown in FIG. 10, at time t0 at which charge of the bit line BL starts, the charge control circuit 2-1 raises the potential of the gate signal Clamp_D of the clamp transistor NMOS0 to (vsax+vthn) or (vsac+vthn), raises the potential of the gate signal Clamp_E of the clamp transistor NMOS0a to (vblc+vthn), raises the potential of the gate signal Clamp_F of the clamp transistor NMOS0b to (vsax+vthn), and raises the potential of the gate signal SW of the switch transistor NMOS0c to (vblc+vthn).

Figure 11:
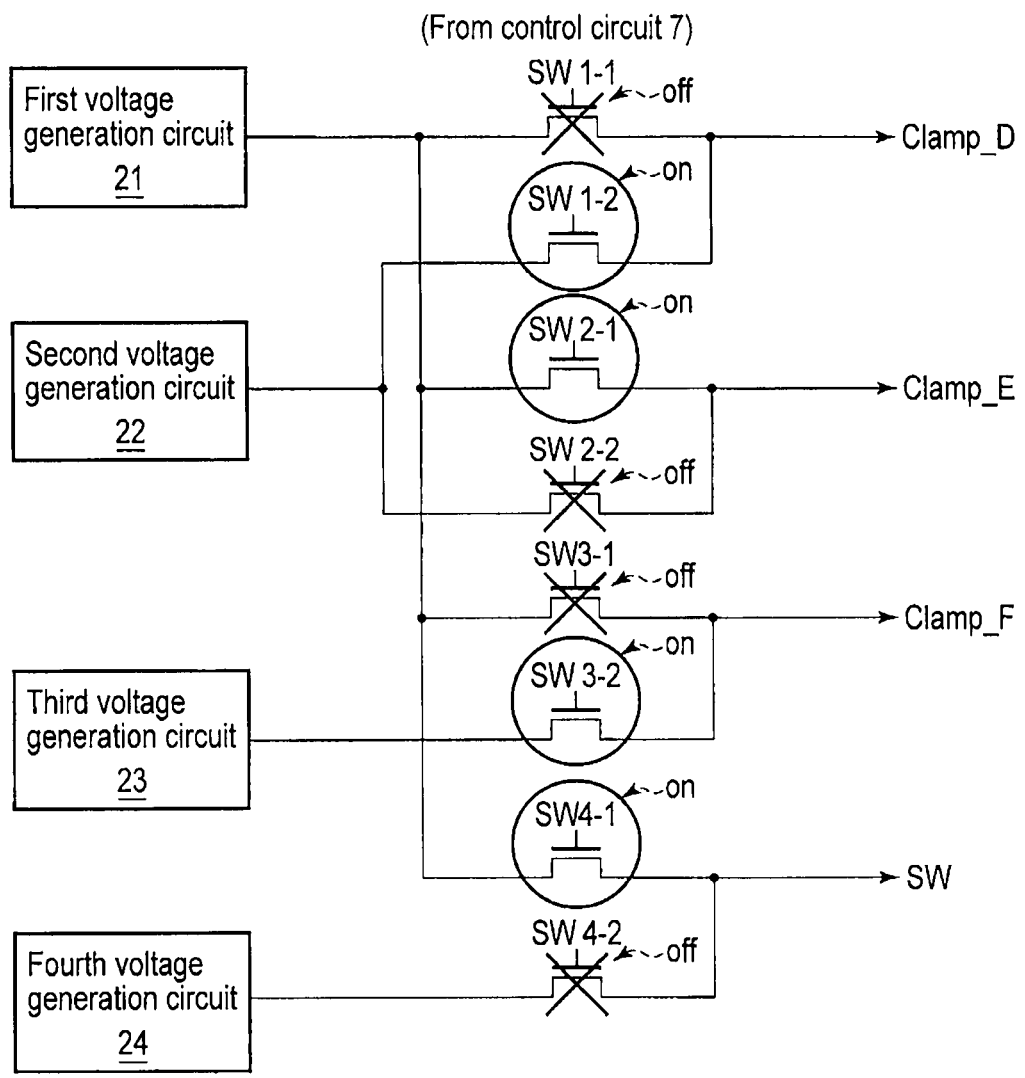
FIG. 11 is a circuit diagram showing the voltage relationship of the charge control circuit in a charge operation according to the first embodiment.

The switching element S22-1 at this time is as shown in FIG. 11. "H" level is input to the control signals SW1-1, SW2-2, SW3-1, and SW4-2 from the control circuit 7, and "L" level is input to the control signals SW1-2, SW2-1, SW3-2, and SW4-1 from the control circuit 7. As a result, the switching elements S21-1, S22-2, S23-1, and S24-1 are turned off, and the switching elements S21-2, S22-1, S23-2, and S24-1 are turned on. Therefore, the gate signals Clamp_D, Clamp_E, Clamp_F, and SW can have a voltage relationship as mentioned above.

Note that as shown in FIG. 7, while the potential of the bit line BL depends on the driving capacity of the NMOS transistor NMOS0 which clamps the bit line potential, that is, during the initial charge period of the bit line BL from time t0 in this embodiment, the charging capacity of the clamp transistor NMOS0 is driven to a maximum degree (gate signal Clamp_D: vsax+vthn, vsac+vthn) to rapidly charge the bit line BL in accordance with the load characteristic (N1) of the transistor NMOS0. This makes it possible to enhance the charging capacity so as to rapidly charge the bit line BL.

After the elapse of a desired period (t1), the charge control circuit 2-1 drops the potential of the gate signal Clamp_D of the clamp transistor NMOS0 to (vblc+vthn), raises the potential of the gate signal Clamp_E of the clamp transistor NMOS0a to (vsac+vthn), maintains the potential of the gate signal Clamp_F of the clamp transistor NMOS0b, and raises the potential of the gate signal SW of the switch transistor NMOS0c to (vdd+vthn).

In this manner, at the end of charge at time t1, the bit line BL is charged by setting the charging capacity of the clamp transistor NMOS0 so as to obtain the load characteristic (N0) of the NMOS transistor. As a result, control is done so that the operating point is determined by the load characteristic (N0) of the NMOS transistor. This makes it possible to provide a semiconductor memory device and a control method therefor which can charge each bit line at high speed by improving the charging capacity of the bit line while maintaining a given operating point of the bit line.

For example, as is obvious from a solid line in FIG. 10, the potential of the bit line BL0 is charged more rapidly in this embodiment than when control according to this embodiment is not performed (broken line: Comparative Example). On the other hand, at the end of charge at time t1, the operating point of the bit line BL0 is maintained at vblc, as in the Comparative Example. The Comparative Example shown in FIG. 10 means herein a case in which, for example, no charge control circuit 2-1 according to this embodiment is provided, so no control operation according to this embodiment is performed.

As shown in FIG. 10, at time t2, when the memory cell current Icell° supplied by the memory cell MC0 is to be sensed after the bit line BL0 is charged, the charge control circuit 2-1 raises the gate signal SW to turn off the switch transistor NMOS0c.

At time t3 a predetermined period (sense period T0) after time t2, the charge control circuit 2-1 drops the gate signal Clamp_F to turn off the clamp transistor NMOS0b. As a result, the potential of the node node_sen is determined, and a sense operation is then performed.

<3. Effect>

As described above, according to the semiconductor memory device and the control operation therefor according to the first embodiment, at least effect (1) can be obtained:

(1) It is possible to provide a semiconductor memory device and a control method therefor which can charge each bit line at high speed by improving the charging capacity of the bit line while maintaining a given operating point of the bit line.

As described above, the charge control circuit 2-1 provided in the semiconductor memory device according to this embodiment controls the gate voltage of the first transistor so that the bit line BL is charged in accordance with the first characteristic (N1) obtained by increasing the charging capacity (current driving capacity) of the first transistor NMOS0 at the start of a bit line charge operation (for example, time t0) in a data read operation from each memory cell, and the bit line BL is then charged in accordance with the second characteristic (N0) obtained by returning the charging capacity (current driving capacity) of the first transistor NMOS0 to the lower charging capacity at the end of the charge operation (for example, time t1).

For example, as shown in the load characteristic graph of FIG. 7, first, at the start of a charge operation (time t0), the bit line BL is rapidly charged in accordance with the NMOS characteristic (N1: first characteristic) obtained by temporarily increasing the charging capacity (current driving capacity) of the clamp transistor NMOS0. On the other hand, at the end of the charge operation (time t1), the bit line BL is charged in accordance with the same NMOS characteristic (N0: second characteristic) as in, for example, the Comparative Example by returning the charging capacity (current driving capacity) of the clamp transistor NMOS0 to the lower charging capacity, thereby controlling so that the final operating point is determined by the NMOS characteristic (N0: second characteristic).

[Second Embodiment (Example in which Excessive Charge of Bit Line is Suppressed)]

A semiconductor memory device and a control operation therefor according to the second embodiment will be described next with reference to FIGS. 12, 13, 14 and 15. This embodiment relates to an example in which excessive charge of a bit line BL is suppressed in returning the NMOS characteristic of a first transistor NMOS0 for clamping to a second characteristic (N1). A detailed description of the same parts as in the first embodiment will not be given hereinafter.

<NMOS Load Characteristic>

The NMOS load characteristic obtained upon making a return to the second characteristic (N1) will be described first.

As shown in FIG. 7, in the first embodiment, in the beginning of charge (time t0), the potential of the bit line BL is rapidly charged in accordance with the first characteristic (N0) by temporarily improving the NMOS characteristic of the first transistor NMOS0 for clamping. On the other hand, at the subsequent end of charge (time t1), the NMOS characteristic of the first transistor NMOS0 for clamping is returned to the second characteristic (N1) to obtain the lower charging capacity. This makes it possible to rapidly charge the bit line BL so as to improve the operating characteristic and thereby speed up the operation, and to guarantee the final operating point of the bit line BL.

However, the first embodiment does not take into consideration the details of the operation for returning the NMOS characteristic from the first characteristic (N0) to the second characteristic (N1) at the end of charge (time t1).

For example, if the potential of the gate signal Clamp_E or SW becomes higher than the potential vblc+vthn before the potential of the gate signal Clamp_D changes to the potential vblc+vthn upon operating the gate signals Clamp_D, Clamp_E, and SW at once, the bit line BL is charged excessively. This makes it necessary to discharge the bit line BL by the amount of excessive charge, so it may take an additional time to stabilize the current when viewed from the sense amplifier SA.

Hence, in the second embodiment, gate signals Clamp_D, Clamp_E, and SW are operated in the following way:

(i) First, the potential of the gate signal Clamp_D of the first transistor NMOS0 for clamping is changed to a potential higher than a potential vblc+vthn to charge a bit line BL0, and the load characteristic of the NMOS transistor is returned to the second characteristic (N0), thereby ensuring a given operating point of the bit line BL.

(ii) Subsequently, the gate potentials of remaining second to fourth transistors NMOS0a, NMOS0b, and NMOS0c are changed to higher gate potentials. Note that a case in which a gate signal Clamp_F of the second transistor remains the same will be taken as an example in this embodiment. The gate potential of at least one of the second to fourth transistors NMOS0a, NMOS0b, and NMOS0c need only be lower than that of the first transistor NMOS0 before the gate potentials of the second to fourth transistors NMOS0a, NMOS0b, and NMOS0c change to gate potentials higher than that of the first transistor NMOS0.

In other words, a transition period T1 is set between the operations defined in (i) and (ii). With this control, the potentials of the second to fourth transistors other than the first transistor NMOS0 can be prevented from becoming higher than the potential vblc+vthn of the gate signal Clamp_D of the first transistor NMOS0 before the potential of the gate signal Clamp_D of the first transistor NMOS0 changes to a potential higher than the potential vblc+vthn. This makes it possible to prevent excessive charge of the bit line BL.

<Arrangement Example>

An arrangement example is practically the same as in the first embodiment, and a detailed description thereof will not be given.

<Data Read Operation>

A data read operation by a sense amplifier SA according to the second embodiment will be described next with reference to FIGS. 12 and 13. This description will be given with reference to a timing chart shown in FIG. 12.

Figure 12:
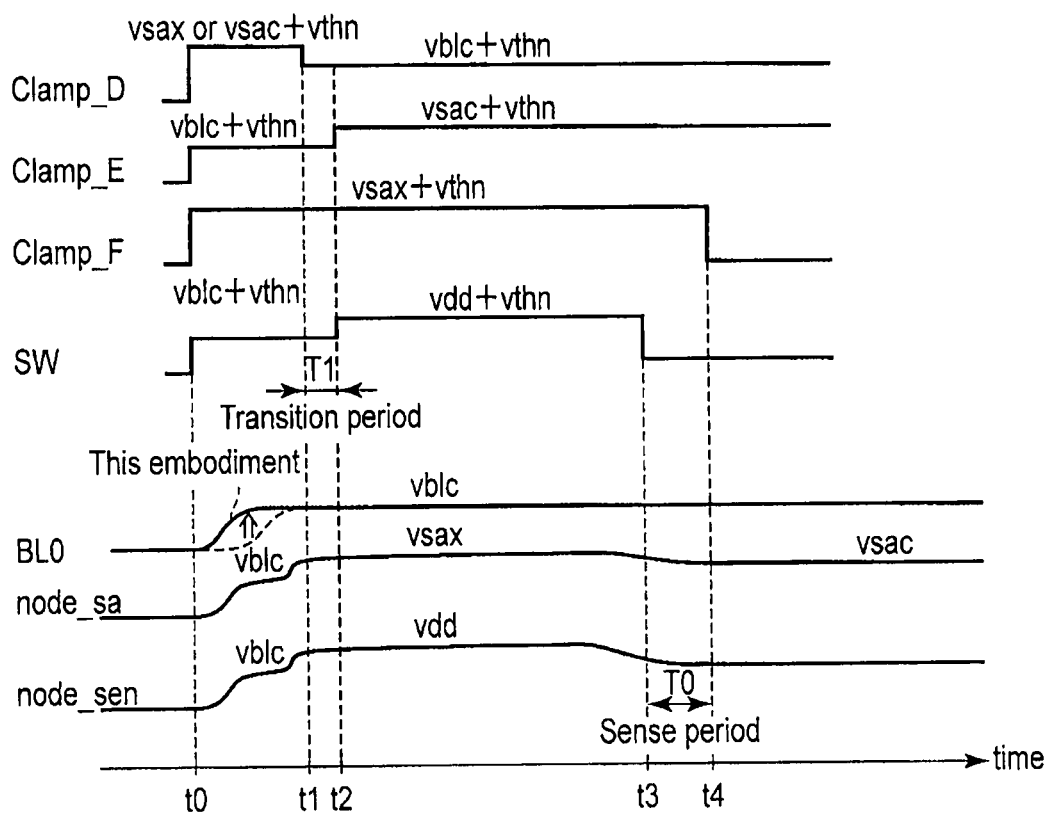
FIG. 12 is a timing chart showing a sense operation in data read according to the second embodiment.

As shown in FIG. 12, first, at time t0 at which charge of the bit line BL starts, that is, in the beginning of charge of the bit line BL at the start of a read operation, a charge control circuit 2-1 raises the potential of the gate signal Clamp_D of the clamp transistor NMOS0 to (vsax+vthn) or (vsac+vthn), raises the potential of the gate signal Clamp_E of the clamp transistor NMOS0a (vblc+vthn), raises the potential of the gate signal Clamp_F of the clamp transistor NMOS0b to (vsax+vthn), and raises the potential of the gate signal SW of the switch transistor NMOS0c to (vblc+vthn).

In this embodiment, at time t0 at which charge of the bit line BL starts, the charging capacity of the clamp transistor NMOS0 is driven to a maximum degree to rapidly charge the bit line BL. This makes it possible to rapidly charge the bit line BL0, as indicated by a solid line in FIG. 12.

At time t1, the charge control circuit 2-1 drops only the potential of the gate signal Clamp_D of the first transistor NMOS0 for clamping to (vblc+vthn). Again, at time t1, the charging capacity of the first transistor NMOS0 for clamping is returned to the second characteristic (N0) to charge the bit line BL0. The first transistor NMOS0 is controlled so that the operating point is determined by the second characteristic (N0).

Figure 13:
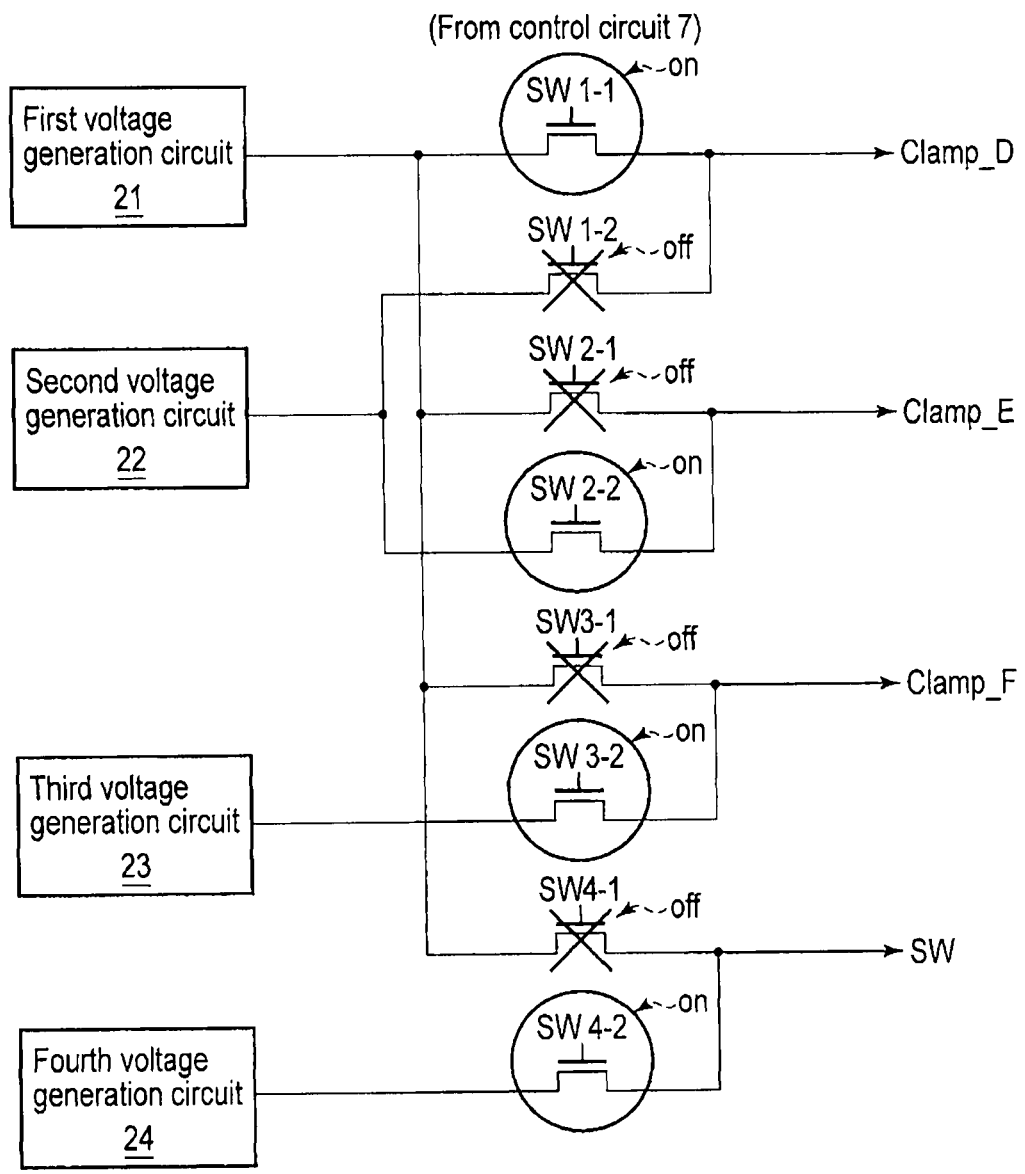
FIG. 13 is a circuit diagram showing the voltage relationship of a charge control circuit in a charge operation according to the second embodiment.

The voltage relationship of the charge control circuit 2-1 at time t1 at which charge of the bit line DL ends is as shown in FIG. 13. At time t1, switching elements S21-2, S22-1, S23-1, S24-1, and S24-2 are turned off, and switching elements S21-1, S22-2, and S23-2 are turned on in accordance with control signals SW1-1 to SW3-2 from a control circuit 7, as shown in FIG. 13. The second embodiment is different in this respect from the first embodiment. Therefore, the gate signals Clamp_D, Clamp_E, Clamp_F, and SW can have a voltage relationship as mentioned above.

At time t2 a predetermined period after time t1, the charge control circuit 2-1 raises the potential of the gate signal Clamp_E of the second transistor NMOS0a for clamping to (vsac+vthn), maintains the potential of the gate signal Clamp_F of the third transistor NMOS0b, and raises the potential of the gate signal SW of the fourth transistor NMOS0c for switching to (vdd+vthn).

In this manner, the second embodiment is different from the first embodiment in that in the former the transition period T1 is set between times t1 and t2, as shown in FIG. 12.

At time t3, when a memory cell current Icell0 supplied by a memory cell MC0 is to be sensed after the bit line BL0 is charged, the charge control circuit 2-1 drops the gate signal SW to turn off the fourth transistor NMOS0c for switching.

At time t4 a predetermined period (sense period T0) after time t3, the charge control circuit 2-1 drops the gate signal Clamp_F of the third transistor NMOS0b for clamping to turn it off so as to determine the potential of a node node_sen, and a sense operation is then performed.

<Effect>

As described above, according to the semiconductor memory device and the control operation therefor according to the second embodiment, at least effect (1) mentioned above can be obtained. Further, according to this embodiment, effects (2) and (3) can be obtained as well:

(2) It is possible to prevent excessive charge of the bit line BL.

The nonvolatile memory device according to the second embodiment controls the first to fourth transistors NMOS0 and NMOS0a to NMOS0c so that the transition period T1 is set between times t1 and t2. With this control, the potentials of the gate signals Clamp_E, Clamp_F, and SW of the second to fourth transistors NMOS0a, NMOS0b, and NMOS0c, respectively, other than the first transistor NMOS0 can be prevented from becoming higher than the potential vblc+vthn of the gate signal Clamp_D of the first transistor NMOS0 before the potential of the gate signal Clamp_D of the first transistor NMOS0 changes to a potential higher than the potential vblc+vthn. This makes it possible to prevent excessive charge of the bit line BL.

(3): This embodiment is advantageous to reduce the manufacturing cost.

Further, in this embodiment, there is no need to add a new constituent element to the arrangement in the first embodiment, so the charge control circuit 2-1 need only be controlled so that the transition period T1 is set. This makes it possible to reduce the manufacturing cost.

[Third Embodiment (Example in Which EQL Period is Further Set in Transition Period)]

A semiconductor memory device and a control operation therefor according to the third embodiment will be described next with reference to FIGS. 14, 15, 16, 17, 18 and 19. The third embodiment is different from the second embodiment in that in the former a period (to be referred to as an EQL period hereinafter) to short the nodes of gate signals Clamp_D, Clamp_E, and SW of first, second, and fourth transistors is set in a transition period T1. A detailed description of the same parts as in the second embodiment will not be given hereinafter.

<NMOS Load Characteristic in Transition Period>

The load characteristic of an NMOS transistor during the transition period T1 will be described first with reference to FIG. 14.

In the second embodiment, excessive charge of the bit line BL can be prevented by setting the transition period T1.

However, the voltage relationship among the transistors during the transition period T1 may exhibit the load characteristic (N2) of the NMOS transistor, which expresses a driving capacity lower than that expressed by the load characteristic (N1) of the NMOS transistor.

That is, the first, second, and fourth transistors NMOS0, NMOS0a, and NMOS0c applied with the lower potential (vblc+vthn) are connected in series with each other, when viewed from the sense amplifier SA. Therefore, the load characteristic of the sense amplifier SA becomes the load characteristic (N2) poorer than the original load characteristic (N1: second characteristic), and this may lower the operating point of the bit line BL, as indicated by a broken line in FIG. 14.

Hence, in the third embodiment, a period (EQL period) to short the nodes of the gate signals Clamp_D, Clamp_E, and SW of the first, second, and fourth transistors is further set in the transition period T1 to generate an intermediate potential. This makes it possible to bring the load characteristic (N1: second characteristic) of a sense amplifier SA during the transition period T1 close to the original load characteristic (N1: second characteristic), and to prevent excessive charge of a bit line BL upon a potential transition from the intermediate potential.

<Arrangement Example>

Bit Line Control Circuit

An example of the arrangement of a bit line control circuit 2 according to the third embodiment will be described next with reference to FIG. 15.

The third embodiment is different from the second embodiment in that in the former a charge control circuit 2-1 controls so that a period (EQL period) to short the nodes of the gate signals Clamp_D, Clamp_E, and SW of the first, second, and fourth transistors is set in the transition period T1 to generate an intermediate potential, as shown in FIG. 15.

Charge Control Circuit

An example of the arrangement of the charge control circuit 2-1 according to the third embodiment will be described next with reference to FIG. 16.

The third embodiment is different from the second embodiment in that in the former the charge control circuit 2-1 further includes transistors EQL1, EQL2, and EQL3, as shown in FIG. 16.

The transistor EQL1 has a current path with its one end and other end connected to the adjacent output terminals of the gate signals Clamp_D and Clamp_E of the first and second transistors NMOS0 and NMOS0a, respectively, and has its gate supplied with a control signal SW4-1 output from a control circuit 7.

The current path of the transistor EQL2 has its one end and other end connected to the adjacent output terminals of the gate signals Clamp_E and Clamp_F of the second and third transistors NMOS0a and NMOS0b, respectively, and has its gate supplied with a control signal SW4-2 output from the control circuit 7.

The current path of the transistor EQL3 has its one end and other end connected to the adjacent output terminals of the gate signals Clamp_E and SW of the third and fourth transistors NMOS0b and NMOS0c, respectively, and has its gate supplied with a control signal SW4-3 output from the control circuit 7.

<Data Read Operation>

A data read operation by the sense amplifier SA according to the third embodiment will be described next with reference to FIGS. 17 and 18. This description will be given with reference to a timing chart shown in FIG. 17.

Figure 17:
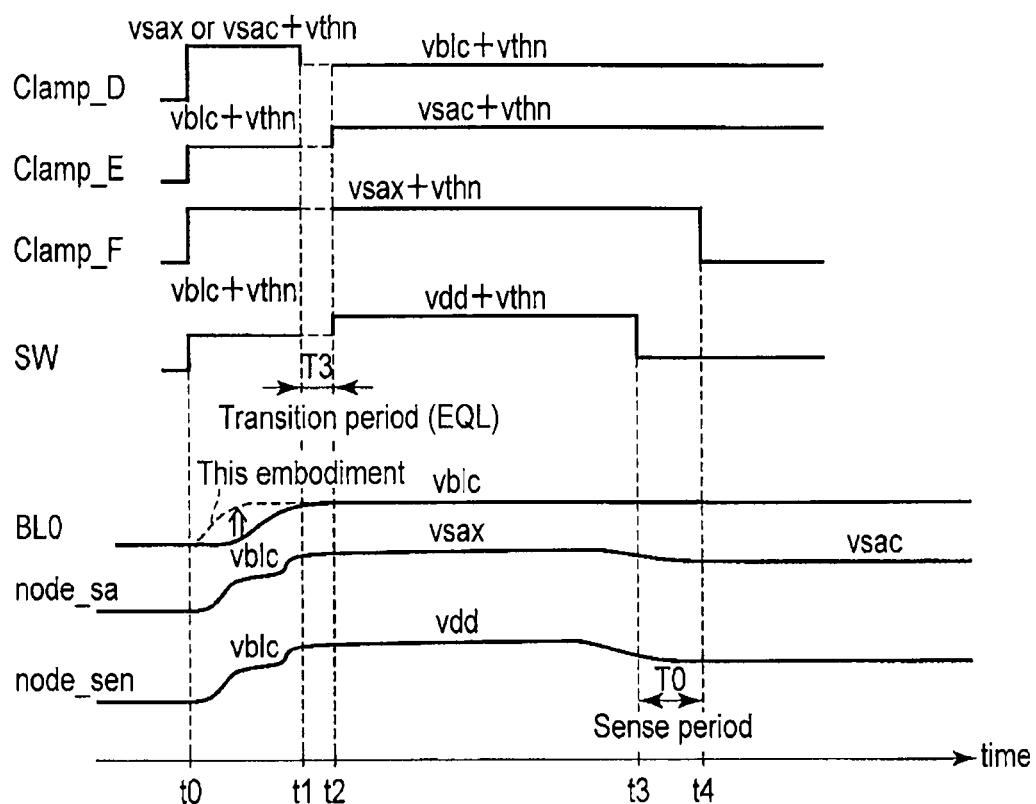
FIG. 17 is a timing chart showing a sense operation in data read according to the third embodiment.

As shown in FIG. 17, first, at time t0, that is, in the beginning of charge of the bit line BL at the start of a read operation, the charge control circuit 2-1 raises the potential of the gate signal Clamp_D of the first transistor NMOS0 for clamping to (vsax+vthn) or (vsac+vthn), raises the potential of the gate signal Clamp_E of the second transistor NMOS0a for clamping to (vblc+vthn), raises the potential of the gate signal Clamp_F of the third transistor NMOS0b for clamping to (vsax+vthn), and raises the potential of the gate signal SW of the fourth transistor NMOS0c for switching to (vblc+vthn).

Note that as described above, in the beginning of charge of the bit line BL (time t0), the charging capacity of the clamp transistor NMOS0 is driven to a maximum degree (gate signal Clamp_D: vsax+vthn, vsac+vthn) to rapidly charge the bit line BL in accordance with the NMOS characteristic (N1: first characteristic). This makes it possible to increase the charging capacity so as to rapidly charge a bit line BL0, as indicated by a broken line in FIG. 17.

At time t1, the charge control circuit 2-1 drops only the potential of the gate signal Clamp_D of the first transistor NMOS0 for clamping to (vblc+vthn). Again, at time t1, the bit line BL0 is charged in accordance with the NMOS characteristic (N0: second characteristic) obtained by returning the charging capacity of the first transistor NMOS0 for clamping to the lower charging capacity, thereby controlling so that the final operating point is determined by the NMOS characteristic (N0: second characteristic).

In addition, in this embodiment, at this time, the charge control circuit 2-1 sets a period (EQL period) T3 to short the nodes of the gate signals Clamp_D, Clamp_E, and SW of the first, second, and fourth transistors during the transition period to generate an intermediate potential. This makes it possible to bring the load characteristic of the sense amplifier SA during the transition period T1 close to the original load characteristic (N1: second characteristic), and to prevent excessive charge of the bit line BL upon a potential transition from the intermediate potential.

Figure 18:
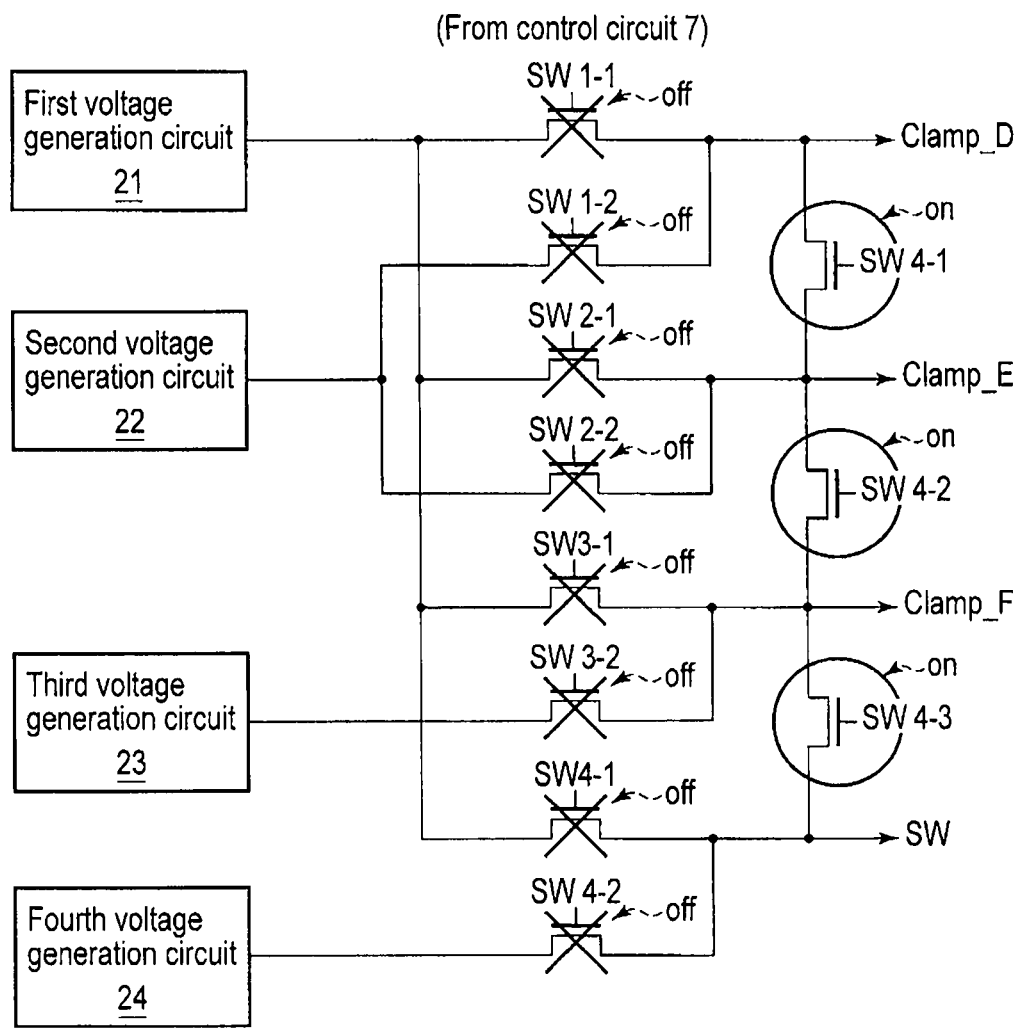
FIG. 18 is a circuit diagram showing the voltage relationship of the charge control circuit in a charge operation according to the third embodiment.

The voltage relationship of the charge control circuit 2-1 during the EQL period T3 is as shown in FIG. 18. During the EQL period T3, all switching elements S21-1 to S24-2 are turned off in accordance with control signals SW1-1 to SW3-2 and the control signals SW4-1 to SW4-3 from the control circuit 7, and the transistors EQL1 to EQL3 are turned on, as shown in FIG. 18. This makes it possible to short the nodes of the gate signals Clamp_D, Clamp_E, Clamp_F, and SW so as to obtain a voltage relationship which generates an intermediate potential.

At time t2 after the elapse of the EQL period T3, the charge control circuit 2-1 raises the potential of the gate signal Clamp_E of the second transistor NMOS0a for clamping to (vsac+vthn), maintains the potential of the gate signal Clamp_F of the third transistor NMOS0b, and raises the potential of the gate signal SW of the fourth transistor NMOS0c for switching to (vdd+vthn).

In this manner, the third embodiment is different from the second embodiment in that in the former the transition period defined between times t1 and t2 becomes the EQL period T3, as shown in FIG. 17.

At time t3, when a memory cell current Icell0 supplied by a memory cell MC0 is to be sensed after the bit line BL0 is charged, first, the charge control circuit 2-1 drops the gate signal SW to turn off the fourth transistor NMOS0c for switching.

At time t4 a predetermined period (sense period T0) after time t3, the charge control circuit 2-1 drops the gate signal Clamp_F of the third transistor NMOS0b for clamping to turn it off so as to determine the potential of a node node_sen, and a sense operation is then performed.

<Effect>

As described above, according to the semiconductor memory device and the control operation therefor according to the third embodiment, at least effects (1) to (3) mentioned above can be obtained. Further, according to this embodiment, effect (4) can be obtained as well:

(4) It is possible to suppress a decrease in load characteristic of the sense amplifier SA during the transition period so as to bring it close to the original load characteristic (N1: second characteristic), and to prevent excessive charge of the bit line BL.

As described above, the third embodiment is different from the second embodiment in that in the former the charge control circuit 2-1 controls so that the period (EQL period) to short the nodes of the gate signals Clamp_D, Clamp_E, and SW of the first, second, and fourth transistors is set in the transition period T1 to generate an intermediate potential. This makes it possible to bring the load characteristic of the sense amplifier SA during the transition period T1 close to the original load characteristic (N1: second characteristic), and to prevent excessive charge of the bit line BL upon a potential transition from the intermediate potential.

Figure 19:
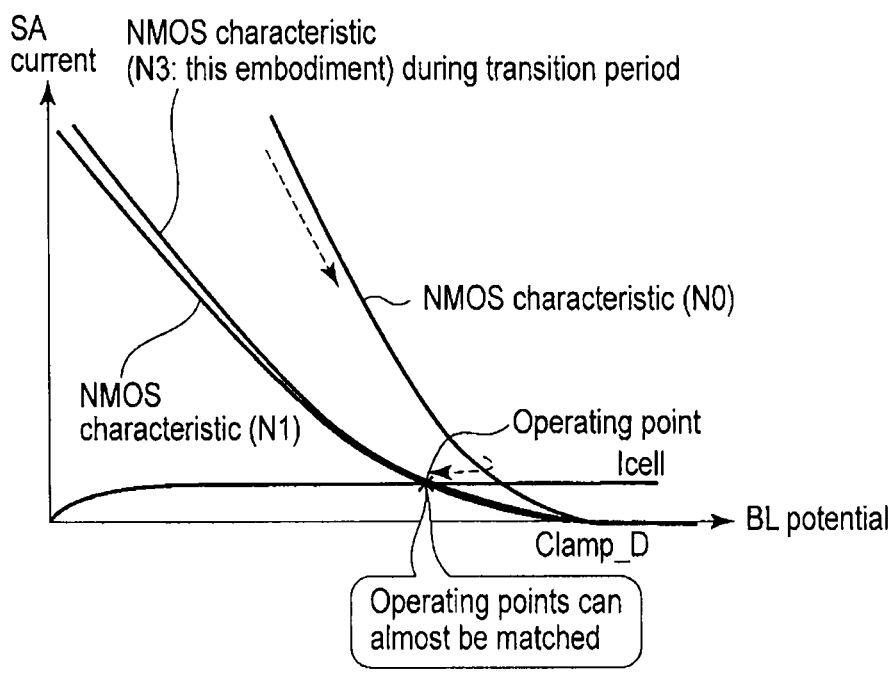
FIG. 19 is a graph showing the load characteristic according to the third embodiment.

As a result, the load characteristic according to this embodiment is as shown in, for example, FIG. 19.

As is obvious from a solid line (N3: this embodiment) shown in FIG. 19, in the third embodiment, it is possible to maintain a given operating point using the load characteristic (N3: third characteristic) obtained by bringing the load characteristic of the sense amplifier SA during the transition period close to the original load characteristic (N1: second characteristic), and to prevent excessive charge of the bit line BL.

Note that the gate signal Clamp_D of the first transistor NMOS0 has changed to the potential (vsax+vthn) or (vsac+vthn) before the transition period of time, the potential of each node always satisfies vblc+vthn<node potential<vsax(vsac)+vthn during the EQL period T3. Accordingly, in theory, the sense amplifier SA has a load characteristic equivalent to a series circuit of the first to fourth transistors NMOS0, NMOS0a, NMOS0b, and NMOS0c having an intermediate node (that is, has the load characteristic between the first characteristic (N0) and the second characteristic N1). However, in practice, it is obvious that the sense amplifier SA has a load characteristic better than the series circuit of the first, second, and fourth transistors NMOS0, NMOS0a, and NMOS0c applied with the potential (vblc+vthn), as in the second embodiment.

In addition, the third embodiment is more advantageous than the first modification (to be described later) in that in the former the current upon shorting can be decreased despite an increase in number of switching elements which constitute the charge control circuit 2-1. In this manner, the arrangement according to the third embodiment is applicable as needed.

[First Modification (Another Example in Which EQL Period is Further Set in Transition Period)]

A semiconductor memory device and a control operation therefor according to the first modification will be described next with reference to FIG. 20. The first modification relates to another example in which a period (EQL period) to short the nodes of gate signals Clamp_D, Clamp_E, and SW of the first, second, and fourth transistors is set in the transition period. A detailed description of the same parts as in the third embodiment will not be given hereinafter.

<Arrangement Example>

Charge Control Circuit

Figure 20:
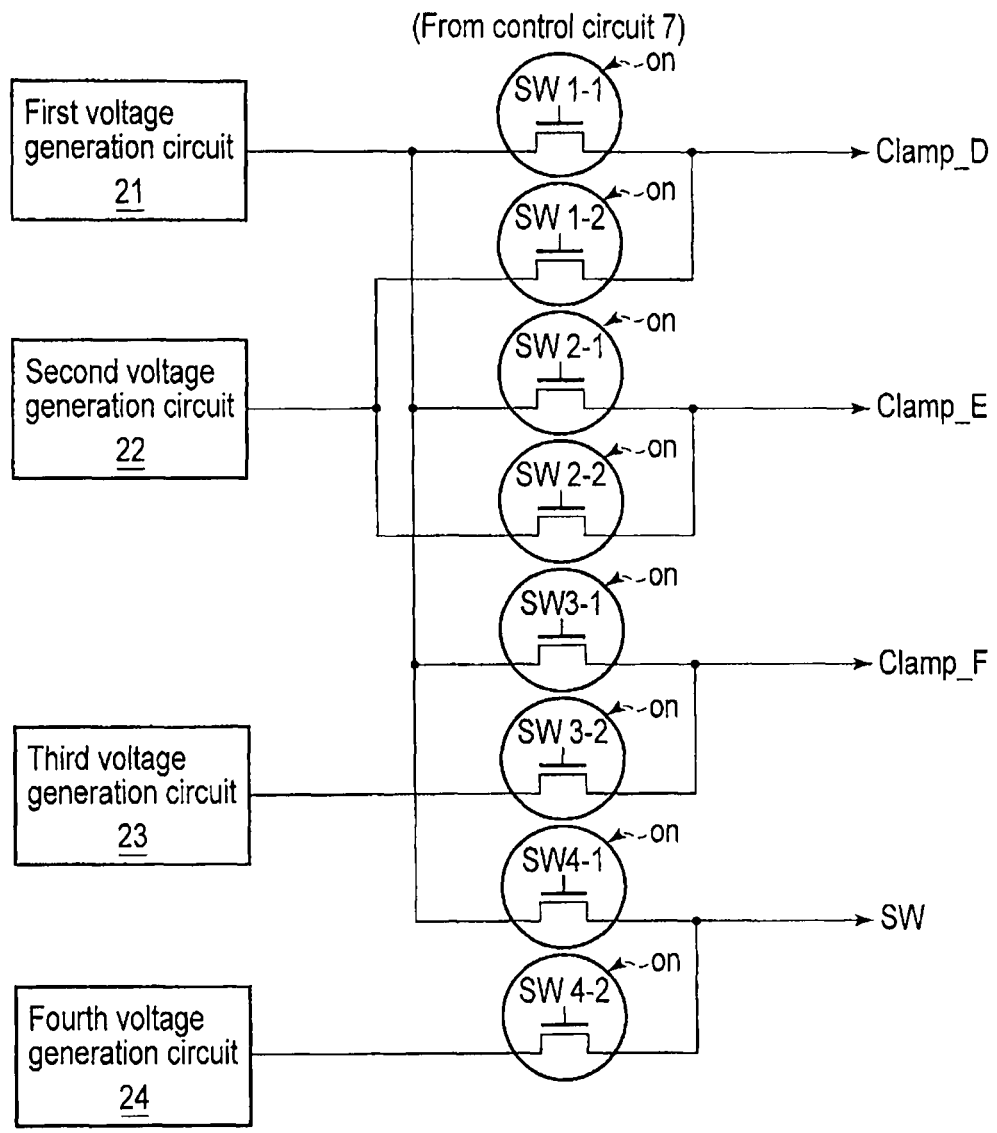
FIG. 20 is a circuit diagram showing the voltage relationship of a charge control circuit in the EQL period according to the first modification.

FIG. 20 illustrates an example of the arrangement of a charge control circuit 2-1 according to the first modification.

The first modification is different from the third embodiment in that in the former the charge control circuit 2-1 includes no transistors EQL1 and EQL2, as shown in FIG. 20.

<Data Read Operation>

In a data read operation, a period (EQL period) T3 to short the nodes of the gate signals Clamp_D, Clamp_E, and SW of the first, second, and fourth transistors is similarly set in the transition period (EQL period T3) to generate an intermediate potential. This makes it possible to bring the load characteristic of a sense amplifier SA during the transition period T3 close to the original load characteristic (N1: second characteristic), and to prevent excessive charge of a bit line BL upon a potential transition from the intermediate potential.

The voltage relationship of the charge control circuit 2-1 during the EQL period T3 is as shown in FIG. 20. During the EQL period T3, all switching elements S21-1 to S24-2 are turned on in accordance with control signals SW-1 to SW3-2 from a control circuit 7, as shown in FIG. 20. This makes it possible to short the nodes of the gate signals Clamp_D, Clamp_E, Clamp_F, and SW so as to obtain a voltage relationship which generates an intermediate potential.

<Effect>

As described above, according to the semiconductor memory device and the control operation therefor according to the first modification, at least effects (1) to (4) mentioned above can be obtained.

Further, the first modification is more advantageous to micropatterning than the third embodiment in that in the former the charge control circuit 2-1 does not require transistors EQL1 and EQL2, thereby reducing the number of switching elements which constitute the charge control circuit 2-1. In this manner, the arrangement according to the first modification is applicable as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including memory cells, which are electrically connected to a bit line; and
a bit line control circuit including a first transistor which has a current path with one end electrically connected to the bit line, and the other end electrically connected to a first node, a second transistor which has a current path with one end electrically connected to the first node, and the other end electrically connected to a power supply voltage, and fixes a potential of the first node, a third transistor which has a current path with one end electrically connected to the first node, and the other end electrically connected to a second node, and fixes the potential of the first node, a fourth transistor which has a current path with one end electrically connected to the second node, and the other end electrically connected to the power supply voltage, and a charge control circuit configured to control gate voltages of the first transistor, the second transistor, the third transistor, and the fourth transistor, respectively, wherein in a read operation which includes a sense operation, the charge control circuit controls the gate voltages of the first transistor, the second transistor, the third transistor, and the fourth transistor, respectively, so that the bit line is charged in accordance with a first current driving capacity of the first transistor after starting to charge up the bit line, and the bit line is charged in accordance with a second current driving capacity of the first transistor before the sense operation, the second current driving capacity being lower than the first current driving capacity.

2. The device of claim 1, wherein the charge control circuit further controls to set a transition period in which the gate voltage of the first transistor is dropped to change the first current driving capacity of the first transistor into the second current driving capacity of the first transistor, and then the gate voltage of one of the second transistor, the third transistor, and the fourth transistor is raised.

3. The device of claim 2, wherein the charge control circuit further controls to short the gate voltages of the first transistor, the second transistor, the third transistor, and the fourth transistor, respectively, during the transition period.

4. The device of claim 1, wherein the charge control circuit further comprises:
a first voltage generation circuit, a second voltage generation circuit, a third voltage generation circuit, and a fourth voltage generation circuit which are configured to generate the gate voltages of the first transistor, the second transistor, the third transistor, and the fourth transistor, respectively; and
a plurality of first switching elements, each of which has a current path with one end and the other end electrically connected in parallel between an output of each of the first voltage generation circuit, the second voltage generation circuit, the third voltage generation circuit, and the fourth voltage generation circuit, and the gate voltage of a corresponding one of the first transistor, the second transistor, the third transistor, and the fourth transistor.

5. The device of claim 4, wherein the charge control circuit further comprises:
a second switching element having a current path with one end and the other end electrically connected between an input of the gate voltage of the first transistor and an input of the gate voltage of the second transistor;
a third switching element having a current path with one end and the other end electrically connected between the input of the gate voltage of the second transistor and an input of the gate voltage of the third transistor; and
a fourth switching element having a current path with one end and the other end electrically connected between the input of the gate voltage of the third transistor and an input of the gate voltage of the fourth transistor.

6. The device of claim 5, wherein the charge control circuit controls to turn off the first switching elements, and to turn on the second switching element, the third switching element, and the fourth switching element, during the transition period.

7. The device of claim 4, wherein the charge control circuit controls to turn on all of the first switching elements during the transition period.

8. A method for controlling a read operation of a semiconductor memory device comprising a memory cell array including memory cells, which are electrically connected to a bit line, and a bit line control circuit including a first transistor which has a current path with one end electrically connected to the bit line, and the other end electrically connected to a first node, a second transistor which has a current path with one end electrically connected to the first node, and the other end electrically connected to a power supply voltage, and fixes a potential of the first node, a third transistor which has a current path with one end electrically connected to the first node, and the other end electrically connected to a second node, and fixes the potential of the first node, a fourth transistor which has a current path with one end electrically connected to the second node, and the other end electrically connected to the power supply voltage, and a charge control circuit configured to control gate voltages of the first transistor, the second transistor, the third transistor, and the fourth transistor, respectively, the method comprising:
charging the bit line in accordance with a first current driving capacity of the first transistor after starting to charge the bit line in the read operation which includes a sense operation; and
charging the bit line in accordance with a second current driving capacity of the first transistor before the sense operation, the second current driving capacity being lower than the first current driving capacity.

9. The method of claim 8, further comprising:
setting a transition period in which the gate voltage of the first transistor is dropped to change the first current driving capacity of the first transistor into the second current driving capacity of the first transistor, and then the gate voltage of one of the second transistor, the third transistor, and the fourth transistor is raised.

10. The method of claim 9, further comprising:
shorting the gate voltages of the first transistor, the second transistor, the third transistor, and the fourth transistor, respectively, during the transition period.

11. The method of claim 8, wherein the charge control circuit further comprises:
a first voltage generation circuit, a second voltage generation circuit, a third voltage generation circuit, and a fourth voltage generation circuit which are configured to generate the gate voltages of the first transistor, the second transistor, the third transistor, and the fourth transistor, respectively; and
a plurality of first switching elements, each of which has a current path with one end electrically and the other end electrically connected in parallel between an output of each of the first voltage generation circuit, the second voltage generation circuit, the third voltage generation circuit, and the fourth voltage generation circuit, and the gate voltage of a corresponding one of the first transistor, the second transistor, the third transistor, and the fourth transistor.

12. The method of claim 11, wherein the charge control circuit further comprises:
a second switching element having a current path with one end electrically and the other end electrically connected between an input of the gate voltage of the first transistor and an input of the gate voltage of the second transistor;

a third switching element having a current path with one end electrically and the other end electrically connected between the input of the gate voltage of the second transistor and an input of the gate voltage of the third transistor; and a fourth switching element having a current path with one end electrically and the other end electrically connected between the input of the gate voltage of the third transistor and an input of the gate voltage of the fourth transistor.

13. The method of claim 12, wherein the charge control circuit controls to turn off the first switching elements, and to turn on the second switching element, the third switching element, and the fourth switching element, during the transition period.

14. The method of claim 11, wherein the charge control circuit controls to turn on the first switching elements during the transition period.

15. The device of claim 1, wherein the first to third transistors include charging capacities lower than a charging capacity of the fourth transistor.

16. The method of claim 8, wherein the first to third transistors include charging capacities lower than the charging capacity of the fourth transistor.

17. The device of claim 1, wherein the first to third transistors include gate lengths greater than a gate length of the fourth transistor.

18. The method of claim 8, wherein the first to third transistors include gate lengths greater than a gate length of the fourth transistor.

* * * * *